(12) United States Patent
Yamaguchi

(10) Patent No.: US 8,796,143 B2
(45) Date of Patent: Aug. 5, 2014

(54) SEMICONDUCTOR DEVICE AND MANUFACTURING METHOD THEREOF

(75) Inventor: Tadashi Yamaguchi, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 194 days.

(21) Appl. No.: 13/295,050

(22) Filed: Nov. 12, 2011

(65) Prior Publication Data

US 2012/0126297 A1    May 24, 2012

(30) Foreign Application Priority Data

Nov. 19, 2010  (JP) ................................ 2010-259022

(51) Int. Cl.
    *H01L 21/44*    (2006.01)
(52) U.S. Cl.
    USPC .................... 438/682; 438/651; 257/E21.619
(58) Field of Classification Search
    CPC ................... H01L 21/02425; H01L 21/28052; H01L 21/32053; H01L 21/823418; H01L 21/823814
    USPC ........... 257/E21.593, E21.619; 438/581, 649, 438/682, 651
    See application file for complete search history.

(56) References Cited

U.S. PATENT DOCUMENTS

| 4,819,037 | A  | * | 4/1989  | Sakakibara et al. ............. 257/24 |
| 6,316,123 | B1 | * | 11/2001 | Lee et al. ....................... 428/641 |
| 6,410,430 | B1 |   | 6/2002  | Lee et al. |
| 2006/0063380 | A1 | * | 3/2006 | Jung et al. ..................... 438/664 |
| 2007/0108525 | A1 | * | 5/2007 | Yang et al. ..................... 257/351 |
| 2007/0278587 | A1 | * | 12/2007 | Aoyama et al. ............... 257/369 |
| 2007/0298575 | A1 | * | 12/2007 | Nouri et al. .................... 438/308 |
| 2009/0011566 | A1 | * | 1/2009  | Okada et al. ................... 438/308 |
| 2009/0127594 | A1 | * | 5/2009  | Arunachalam et al. ........ 257/288 |
| 2009/0158234 | A1 | * | 6/2009  | Dobuzinsky et al. ........... 716/17 |
| 2009/0191707 | A1 | * | 7/2009  | Okada et al. ................... 438/664 |
| 2009/0224308 | A1 | * | 9/2009  | Dobuzinsky et al. ......... 257/324 |
| 2009/0289285 | A1 | * | 11/2009 | Iwamoto ....................... 257/288 |
| 2010/0062562 | A1 | * | 3/2010  | Smythe et al. ................ 438/102 |
| 2010/0093139 | A1 | * | 4/2010  | Futase ........................... 438/197 |

(Continued)

FOREIGN PATENT DOCUMENTS

| JP | 2002-141504 A | 5/2002 |
| JP | 2010-114449 A | 5/2010 |

OTHER PUBLICATIONS

Yamaguchi et al, "Low-Resistive and Homogenous NiPt-Silicide Formation using Ultra-Low Temperature Annealing with Microwave System for 22nm-mode CMOS and beyond", IEEE, pp. 26.1.1-26.1.4, Dec. 6-8, 2010 at the 2010 IEEE International Electron Devices Meeting (IEDM).*

*Primary Examiner* — William F Kraig
*Assistant Examiner* — Joseph C Nicely
(74) *Attorney, Agent, or Firm* — Miles & Stockbridge P.C.

(57) ABSTRACT

A semiconductor device in which a metal silicide layer is formed by a salicide process is improved in reliability. By a salicide process according to a partial reaction method, metal silicide layers are formed over respective surfaces of gate electrodes, $n^+$-type semiconductor regions, and $p^+$-type semiconductor regions. In a first heat treatment when the metal silicide layers are formed, a heat-conduction type anneal apparatus is used for the heat treatment of a semiconductor wafer. In a second heat treatment, a microwave anneal apparatus is used for the heat treatment of the semiconductor wafer, thereby reducing the temperature of the second heat treatment and preventing abnormal growth of the metal silicide layers. Thus, a junction leakage current in the metal silicide layers is reduced.

9 Claims, 23 Drawing Sheets

(56) References Cited

U.S. PATENT DOCUMENTS

| | | |
|---|---|---|
| 2010/0117238 A1 | 5/2010 | Nemouchi et al. |
| 2010/0155866 A1* | 6/2010 | Guo et al. ............ 257/419 |
| 2010/0187636 A1* | 7/2010 | Yang et al. ........... 257/369 |
| 2010/0193876 A1* | 8/2010 | Ramani et al. ........ 257/377 |
| 2011/0006409 A1* | 1/2011 | Gruenhagen et al. ... 257/666 |
| 2011/0076787 A1* | 3/2011 | Ahmad et al. .......... 438/5 |
| 2011/0101472 A1* | 5/2011 | Domenicucci et al. ... 257/412 |
| 2011/0169058 A1* | 7/2011 | Frye et al. ............ 257/288 |
| 2011/0198670 A1* | 8/2011 | Ramani et al. ........ 257/192 |
| 2011/0237061 A1* | 9/2011 | Yamaguchi et al. ..... 438/592 |
| 2011/0248355 A1* | 10/2011 | Futase ................ 257/383 |
| 2012/0077321 A1* | 3/2012 | Okada et al. .......... 438/299 |
| 2012/0153359 A1* | 6/2012 | Frye et al. ........... 257/213 |
| 2012/0326317 A1* | 12/2012 | Wu .................... 257/769 |
| 2013/0005080 A1* | 1/2013 | Smythe et al. ........ 438/102 |
| 2013/0011981 A1* | 1/2013 | Zhu et al. ............ 438/269 |
| 2013/0062705 A1* | 3/2013 | Hase ................... 257/377 |
| 2013/0134528 A1* | 5/2013 | Nguyen et al. ........ 257/415 |

* cited by examiner

FIG. 2(a)

NMIS (RTA)

|       | TOP  | MIDDLE | BOTTOM |
|-------|------|--------|--------|
| Ni    | 1.6  | 2.65   | 1      |
| Si    | 1    | 1.3    | 1.9    |
| Pt    | 1.9  | 0.8    | 0.25   |
| Pt/Ni | 1.19 | 0.3    | 0.25   |
| Pt/Si | 1.9  | 0.62   | 0.13   |

FIG. 2(b)

PMIS (RTA)

|       | TOP | MIDDLE | BOTTOM |
|-------|-----|--------|--------|
| Ni    | 2.1 | 4      | 1.3    |
| Si    | 1.4 | 2      | 2.4    |
| Pt    | 2.1 | 0.6    | 0.3    |
| Pt/Ni | 1   | 0.15   | 0.23   |
| Pt/Si | 1.5 | 0.3    | 0.13   |

FIG. 2(c)

NMIS (MWA)

|       | TOP  | MIDDLE | BOTTOM |
|-------|------|--------|--------|
| Ni    | 1.3  | 1.9    | 0.1    |
| Si    | 1.1  | 1.3    | 2.3    |
| Pt    | 2.7  | 1      | 0.7    |
| Pt/Ni | 2.08 | 0.53   | 7      |
| Pt/Si | 2.45 | 0.77   | 0.3    |

FIG. 2(d)

PMIS (MWA)

|       | TOP | MIDDLE | BOTTOM |
|-------|-----|--------|--------|
| Ni    | 0.5 | 2.4    | 1.7    |
| Si    | 0.5 | 1.3    | 1.7    |
| Pt    | 0.5 | 1.3    | 1.7    |
| Pt/Ni | 1   | 0.54   | 1      |
| Pt/Si | 1   | 1      | 1      |

SEMICONDUCTOR DEVICE AND MANUFACTURING METHOD THEREOF

CROSS-REFERENCE TO RELATED APPLICATIONS

The disclosure of Japanese Patent Application No. 2010-259022 filed on Nov. 19, 2010 including the specification, drawings and abstract is incorporated herein by reference in its entirety.

BACKGROUND

The present invention relates to a semiconductor device and a manufacturing method thereof, and particularly to a technology which is effective when applied to the manufacturing of a semiconductor element having a metal silicide layer.

With the increasing integration of semiconductor devices, a field effect transistor (MISFET: Metal Insulator Semiconductor Field Effect Transistor) has been scaled down according to a scaling rule. However, the resistances of a gate electrode and source/drain regions increase to result in the problem that, even when the field effect transistor is scaled down, a high-speed operation cannot be obtained. To solve the problem, a Salicide (Self Aligned Silicide) technique has been studied in which a low-resistance metal silicide layer such as, e.g., nickel silicide layer or cobalt silicide layer is formed by self-alignment over a surface of each of a conductive film forming the gate electrode and semiconductor regions forming the source/drain regions to thereby reduce the resistances of the gate electrode and the source/drain regions.

In Japanese Unexamined Patent Publication No. 2010-114449 (Patent Document 1), it is disclosed that a silicide layer containing NiSi (nickel monosilicide) and retaining phase stability and film stability even at a high temperature is formed over the main surface of a semiconductor substrate. It is also disclosed that the silicide layer described above contains, e.g., Pt (platinum) or the like.

RELATED ART DOCUMENTS

Patent Documents

[Patent Document 1]
Japanese Unexamined Patent Publication No. 2010-114449
[Patent Document 2]
Japanese Unexamined Patent Publication No. 2002-141504

SUMMARY

As semiconductor devices have been scaled down, it has been required to reduce the film thickness of a silicide layer formed over the upper surface of each of the source/drain regions and gate electrodes of field-effect transistors. However, when the thickness of the silicide layer is reduced, the silicide layer is physically unstabilized and abnormally grows in the semiconductor substrate. As a result, in the semiconductor substrate under the gate electrodes, the silicide layers mainly containing $NiSi_2$ are formed. In this case, a leakage defect resulting from a junction leakage current may increase to degrade the reliability of the semiconductor device, and therefore it is difficult to reduce the film thickness of the silicide layer.

In recent years, in a salicide process for forming a silicide layer, a metal film formed over a semiconductor substrate is caused to react with a part of a source region, a drain region, and a gate electrode to form the silicide layer. Accordingly, it is common practice to adopt a method which performs an anneal treatment (heat treatment) in two separate steps. In this case, in a 2nd anneal treatment as a second heat treatment, the semiconductor substrate is heated at temperature higher than that of a 1st anneal treatment as a first heat treatment.

However, when the second heat treatment is performed at a high temperature of about 500 to 600° C. to form an extremely thin silicide layer having a film thickness of, e.g., not more than 14 nm, it is difficult to suppress abnormal growth of the silicide layer because of the excessively high temperature of the heat treatment. On the other hand, when the second heat treatment is performed using a lamp type or heat-conduction type anneal apparatus or the like, it is difficult to form a silicide layer with a uniform film thickness. Thus, when the film thickness of the silicide layer cannot be controlled accurately and abnormal growth of crystals (grains) in the silicide layer or the like occurs, a leakage current is likely to flow between the semiconductor substrate and the silicide layer, and so forth, resulting in the problem of the degraded junction leakage characteristic of the silicide layer.

In Japanese Unexamined Patent Publication No. 2002-141504 [Patent Document 2], it is disclosed that a heat treatment is performed at a temperature of not less than 850° C. for a period of not more than 60 seconds using, e.g., a microwave anneal process to form a silicide layer. Here, it is stated that, by performing a first heat treatment using, e.g., the microwave anneal process or the like in the step of forming the silicide layer and subsequently performing a second heat treatment under the same conditions as or different conditions from those for the first heat treatment, the silicide layer can be activated. Thus, it is disclosed that the heat treatment using a microwave is performed also in the 1st anneal.

However, if the first heat treatment is to be performed using the microwave as shown in Patent Document 2, a problem arises that a junction leakage current in the silicide layer increases compared with that in the case where the first heat treatment is performed using a heat-conduction type anneal apparatus or the like. The reason for this is as follows, which has been found by the present inventors. That is, with the microwave, it may be occasionally difficult to uniformly heat the semiconductor substrate having a pure metal attached to the entire surface thereof. If the semiconductor substrate containing, e.g., silicon is directly heated with the microwave, abnormal growth of the silicide layer is more likely to occur due to a subsequent heat treatment, such as the second heat treatment or the step of forming interconnects, than in the case where the first heat treatment is performed by heating a metal film over the semiconductor substrate using a heat-conduction type anneal apparatus or the like.

An object of the present invention is to provide a technique for improving the junction leakage characteristic of a semiconductor device having a silicide layer.

The above and other objects and novel features of the present invention will become apparent from a statement in the present specification and the accompanying drawings.

The following is a brief description of the outline of a representative embodiment of the invention disclosed in the present application.

That is, a method of manufacturing a semiconductor device of the present invention includes the steps of: (a) preparing a semiconductor substrate; (b) forming a semiconductor region in the semiconductor substrate; (c) forming a metal film over the semiconductor substrate including the semiconductor region; (d) performing a first heat treatment to cause the metal film to selectively react with the semiconductor region and form a metal silicide layer over the semiconductor region; (e) after the step (d), removing an unreacted part of the metal film to leave the metal silicide layer over the semiconductor region; (f) after the step (e), performing a second heat treatment; and (g) after the step (f), forming an insulating film over the semiconductor substrate including the metal silicide layer. In the step (d), the first heat treatment is performed using a heat-conduction type anneal apparatus. In the step (f), the second heat treatment is performed using a microwave anneal apparatus.

The following is a brief description of an effect obtained according to the representative embodiment of the invention disclosed in the present application.

According to the representative embodiment, it is possible to improve the reliability of a semiconductor device having an element in which a metal silicide layer is formed over a surface of a semiconductor substrate.

BRIEF DESCRIPTION OF THE DRAWINGS

FIGS. 2(a) to 2(d) are tables showing Pt concentration distributions in the respective metal silicide layers of the semiconductor device as the embodiment of the present invention and a semiconductor device as a comparative example, of which FIG. 2(a) is the table showing the Pt concentration distribution in each of the metal silicide layers of an n-channel MISFET of the comparative example, FIG. 2(b) is the table showing the Pt concentration distribution in the metal silicide layer of a p-channel MISFET of the comparative example, FIG. 2(c) is the table showing the Pt concentration distribution in each of the metal silicide layers of an n-channel MISFET as the embodiment of the present invention, and FIG. 2(d) is the table showing the Pt concentration distribution in the metal silicide layer of a p-channel MISFET as the embodiment of the present invention;

DETAILED DESCRIPTION

Figure 1:
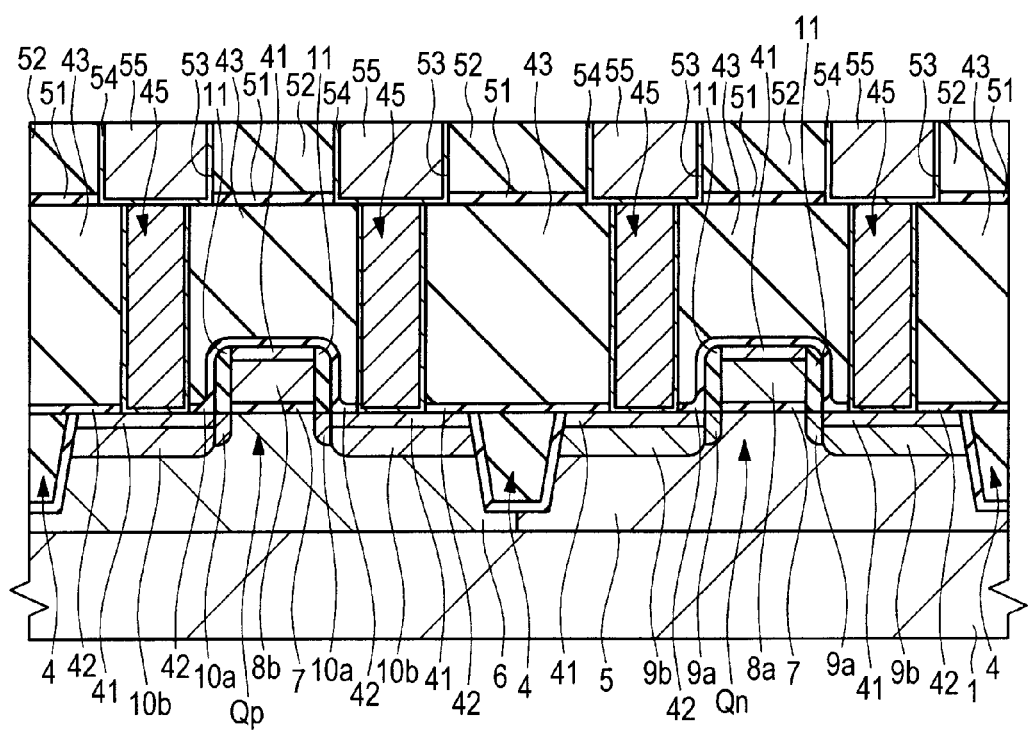
FIG. 1 is a main-portion cross-sectional view showing a semiconductor device as an embodiment of the present invention.

Referring to the drawings, an embodiment of the present invention will be described below in detail. Note that, throughout all the drawings for illustrating the embodiment, members having the same functions are designated by the same reference numerals, and a repeated description thereof is omitted. Additionally, in the following embodiment, a description of the same or like parts will not be repeated in principle unless it is particularly necessary.

A semiconductor device of the present embodiment will be described with reference to FIGS. 1 and 2. FIG. 1 is a cross-sectional view of the semiconductor device in which MIS (Metal Insulator Semiconductor) type FETs (Field Effect Transistors) (hereinafter simply referred to as MISFETs) are formed over a semiconductor substrate 1.

As shown in FIG. 1, the main surface of the semiconductor substrate 1 has first regions and second regions which are separated by isolation regions 4 formed in the upper surface of the semiconductor substrate 1. In the main surface of the semiconductor substrate 1 in each of the first regions, a MISFET (p-channel MISFET Qp) having a p-type channel is formed. In the main surface of the semiconductor substrate 1 in each of the second regions, a MISFET (n-channel MISFET Qn) having an n-type channel is formed.

The p-channel MISFET Qp has a gate electrode 8b formed via a gate insulating film 7 over an n-type well 6 which is an n-type channel semiconductor layer obtained by introducing an n-type impurity (e.g., P (phosphorus)) into the main surface of the semiconductor substrate 1, and source/drain regions formed in the main surface of the semiconductor substrate 1 such that the n-type well 6 immediately under the gate electrode 8b is interposed therebetween. Over the both side walls of the gate electrode 8b formed of, e.g., a polysilicon film, sidewalls 11 each formed of a silicon oxide film or the like are formed. In the main surface of the semiconductor substrate 1 located under the sidewalls 11, p$^-$-type semiconductor regions 10a which are semiconductor regions into which a p-type impurity (e.g., B (boron)) has been introduced at a relatively low concentration are formed. In regions outward of the p$^-$-type semiconductor regions 10a with respect to a region immediately under the gate electrode 8b, i.e., in the main surface of the semiconductor substrate 1 located between the p$^-$-type semiconductor regions 10a and the isolation regions 4, p$^+$-type semiconductor regions 10b into which a p-type impurity (e.g., B (boron)) has been introduced at a concentration higher than in the p$^-$-type semiconductor regions 10a are formed. The source/drain regions are formed of the p$^-$-type semiconductor regions 10a and the p$^+$-type semiconductor regions 10b.

Likewise, the n-channel MISFET Qn has a gate electrode 8a formed via the gate insulating film 7 over a p-type well 5 which is a p-type channel semiconductor layer obtained by introducing a p-type impurity (e.g., B (boron)) into the main surface of the semiconductor substrate 1, and source/drain regions formed in the main surface of the semiconductor substrate 1 such that the p-type well 5 immediately under the gate electrode 8a is interposed therebetween. Over the both side walls of the gate electrode 8a formed of, e.g., a polysilicon film, the sidewalls are formed. In the main surface of the semiconductor substrate 1 located under the sidewalls 11, n$^-$-type semiconductor regions 9a which are semiconductor regions into which an n-type impurity (e.g., P (phosphorus)) has been introduced at a relatively low concentration are formed. In the main surface of the semiconductor substrate 1 located between the n$^-$-type semiconductor regions 9a and the isolation regions 4, n$^+$-type semiconductor regions 9b into which an n-type impurity (e.g., P (phosphorus)) has been introduced at a concentration higher than in the n$^-$-type semiconductor regions 9a are formed. The source/drain regions are formed of the n$^-$-type semiconductor regions 9a and the n$^+$-type semiconductor regions 9b.

Over the respective upper surfaces of the n$^+$-type semiconductor regions 9b, the p$^+$-type semiconductor regions 10b, and the gate electrodes 8a and 8b, metal silicide layers 41 each containing NiSi (mono-nickel silicide), which is a compound of Ni (nickel) and Si (silicon), and Pt (platinum) are formed. The main surface of the semiconductor substrate 1 including the re-channel MISFET Qn, the p-channel MISFET Qp, the metal silicide layers 41, the sidewalls 11, and the isolation regions 4 is covered with an insulating film 43 which is a thick interlayer insulating film via a thin insulating film 42 serving as an etching stopper film. From the upper surface of the insulating film 43 to the upper surfaces of the metal silicide layers 41, contact holes extend through the insulating film 43.

In the contact holes over the metal silicide layers 41, plugs 45 for supplying predetermined potentials to the n-channel MISFET Qn and the p-channel MISFET Qp are formed. The plugs 45 are coupling members mainly containing, e.g., W (tungsten). The metal silicide layers 41 are for reducing contact resistances between the plugs 45 each formed of a metal material such as tungsten and the semiconductor substrate 1 mainly formed of silicon and ohmically coupling the plugs 45 to the n$^+$-type semiconductor regions 9b and p$^+$-type semiconductor regions 10b of the source/drain regions and to the gate electrodes 8a and 8b.

Over the insulating film 43 and the plugs 45, an insulating film 52 serving as an interlayer insulating film is formed via a stopper insulating film 51. In the insulating film 52, a plurality of interconnect trenches 53 exposing the upper surfaces of the plugs 45 are formed. In the interconnect trenches 53, interconnects 55 for supplying the predetermined potentials to the n-channel MISFET Qn and the p-channel MISFET Qp are buried via barrier conductor films 54. Note that the barrier conductor films 54 are barrier films for preventing Cu (copper) mainly contained in the interconnects 55 from being diffused into the insulating films 52 and 43 or the like. Note that the contact holes immediately over the gate electrodes 8a and 8b, the plugs 45, and the interconnects 55 are not shown in FIG. 1 since they are not formed in the regions shown in FIG. 1, but are formed in other regions.

A characteristic feature of the semiconductor device of the present embodiment is that each of the metal silicide layers contains Pt (platinum) and, at the bottom surface of the metal silicide layer 41, i.e., at the interface between the metal silicide layer 41 and the semiconductor substrate 1, the concentration of Pt is higher in the p-channel MISFET Qp than in the n-channel MISFET Qn. Conversely, at the upper surface of the metal silicide layer 41, the concentration of Pt is higher in the n-channel MISFET Qn than in the p-channel MISFET Qp. That is, in each of the metal silicide layers 41 of the re-channel MISFET Qn, Pt is present (segregated) in a larger amount at the upper surface thereof than at the bottom surface thereof. On the other hand, in each of the metal silicide layers 41 of the p-channel MISFET Qp, Pt is present (segregated) in a larger amount at the bottom surface thereof than at the upper surface thereof. Note that the segregation mentioned herein indicates a state where a material such as, e.g., Pt is diffused concentrically into a specified region of a certain structure and present at a density higher than in the other region of the foregoing structure or a state where the density of the material in a region of a certain structure is higher than in an equivalent region of another structure as a comparison target.

The metal silicide layer 41 having such a Pt distribution is formed by performing two heat treatments which are performed when the metal silicide layers 41 are formed such that, e.g., a heat-conduction type anneal apparatus, not a microwave anneal apparatus, is used for the first heat treatment (1st anneal treatment) and the microwave anneal apparatus is used for the second heat treatment (2nd anneal treatment), as will be described later. Note that the microwave anneal apparatus, the heat-conduction type anneal apparatus, and other anneal apparatus will be described later.

As will be described later in detail, when the first heat treatment is performed using, e.g., the heat-conduction type anneal apparatus, not the microwave anneal apparatus, and the second heat treatment is performed using the microwave anneal apparatus, a junction leakage current in the metal silicide layer 41 can be reduced compared with the case where the first heat treatment is performed using the microwave anneal apparatus or where the second heat treatment is performed using a lamp type anneal apparatus or the heat-conduction type anneal apparatus. This is because, by using the heat-conduction type anneal apparatus or the like, not the microwave anneal apparatus, for the first heat treatment and using the microwave anneal apparatus for the second heat treatment to form the metal silicide layer 41 as described above, it is possible to prevent abnormal growth of the metal silicide layer and accurately control the film thickness of the extremely thin metal silicide layer 41.

In addition, the p-channel MISFET Qp has a characteristic such that, when Pt in the metal silicide layers 41 is segregated at the interfaces between the metal silicide layers 41 and the semiconductor substrate 1, the contact resistances between the metal silicide layers 41 and the semiconductor substrate 1 decrease to improve the performance of the semiconductor device. Conversely, the n-channel MISFET Qn has a characteristic such that, when Pt in the metal silicide layers 41 is segregated at the interfaces between the metal silicide layers 41 and the semiconductor substrate 1, the contact resistances between the metal silicide layers 41 and the semiconductor substrate 1 increase to degrade the performance of the semiconductor device. That is, in the p-channel MISFET Qp, it is preferable to cause Pt to be segregated in a larger amount at the bottom surfaces of the metal silicide layers 41 while, in the n-channel MISFET Qn, it is preferable to cause Pt to be segregated in a larger amount in the upper portions of the metal silicide layers 41 than at the bottom surfaces thereof.

When the microwave anneal apparatus is used in the first heat treatment or when the lamp type anneal apparatus or heat-conduction type anneal apparatus is used in the second heat treatment, in each of the p-channel MISFET Qp and the n-channel MISFET Qn, Pt is segregated in the upper surfaces of the metal silicide layers 41. This causes no problem in the n-channel MISFET Qn, but causes the problem of increased contact resistances between the semiconductor substrate 1 and the metal silicide layers 41 in the p-channel MISFET Qp.

Here, FIGS. 2(a) to 2(d) show tables showing ratios among the respective amounts of Ni (nickel), Si (silicon), and Pt (platinum) in the metal silicide layers. FIG. 2(a) is the table showing a Pt concentration distribution in each of the metal silicide layers of an n-channel MISFET as a comparative example. FIG. 2(b) is the table showing the Pt concentration distribution in the metal silicide layer of a p-channel MISFET as the comparative example. FIG. 2(c) is the table showing the Pt concentration distribution in each of the metal silicide layers of an n-channel MISFET as the present embodiment. FIG. 2(d) is the table showing the Pt concentration distribution in the metal silicide layer of a p-channel MISFET as the present embodiment.

Of the four tables shown in FIGS. 2(a) to 2(d), the uppermost table (FIG. 2(a)) shows the ratio among the respective amounts of Ni, Si, and Pt in each of the upper layer (top), middle layer (middle), and lower layer (bottom) of the metal silicide layer of the n-channel MISFET (NMIS) formed by performing each of the first and second heat treatments using the heat-conduction type anneal apparatus. There are also shown a ratio (Pt/Ni) of Pt to Ni and a ratio (Pt/Si) of Pt to Si in each of the upper layer, middle layer, and lower layer of the metal silicide layer. The second uppermost table (FIG. 2(b)) of FIGS. 2(a) to 2(d) shows the ratio among the respective amounts of Ni, Si, and Pt in each of the upper layer, middle layer, and lower layer of the metal silicide layer of the p-channel MISFET (PMIS) formed under the same conditions as in the table of FIG. 2(a), the ratio of Pt to Ni therein, and the ratio of Pt to Si therein.

By contrast, the third uppermost table (FIG. 2(c)) of FIGS. 2(a) to 2(d) shows the ratio among the respective amounts of Ni, Si, and Pt in each of the upper layer, middle layer, and lower layer of the metal silicide layer of the n-channel MISFET (NMIS) formed using the heat-conduction type anneal apparatus in the first heat treatment and performing a microwave anneal treatment (MWA: Microwave Annealing) as the second heat treatment in the present embodiment, the ratio of Pt to Ni therein, and the ratio of Pt to Si therein. The lowermost table (FIG. 2(d)) of FIGS. 2(a) to 2(d) shows the ratio among the respective amounts of Ni, Si, and Pt in each of the upper layer, middle layer, and lower layer of the metal silicide layer of the p-channel MISFET (PMIS) of the present embodiment formed under the same conditions as in the table of FIG. 2(c), the ratio of Pt to Ni therein, and the ratio of Pt to Si therein.

That is, the tables shown in FIGS. 2(a) and 2(b) are for illustrating element distributions in the metal silicide layers of a semiconductor device as the comparative example, while the tables shown in FIGS. 2(c) and 2(d) are for illustrating element distributions in the metal silicide layers of the semiconductor device of the present embodiment.

As can be seen from FIGS. 2(a) to 2(d), in the metal silicide layers in the tables of FIGS. 2(a) and 2(b) as the comparative example, Pt (platinum) is segregated in the upper layers of the metal silicide layers. By contrast, as shown in the table of FIG. 2(c), the metal silicide layer of the re-channel MISFET of the present embodiment has the Pt distribution having substantially the same tendency as that of the comparative example shown in the table of FIG. 2(a). However, in the metal silicide layer of the p-channel MISFET of the present embodiment shown in FIG. 2(d), Pt is distributed such that the Pt concentration tends to increase with increasing distance from the upper layer of the metal silicide layer toward the lower layer thereof, which is different from the tendency of the comparative example shown in the table of FIG. 2(b). That is, it can be said that Pt (platinum) in the metal silicide layer of the p-channel MISFET is segregated in a larger amount in the bottom portion of the metal silicide layer than in the comparative example.

That is, as can be seen from FIGS. 2(c) and 2(d), in the silicide layer of the p-channel MISFET, the ratio of Pt to Si increases with increasing distance from the upper surface thereof toward the bottom surface thereof and, in the silicide layer of the n-channel MISFET, the ratio of Pt to Si decreases with increasing distance from the upper surface thereof toward the bottom surface thereof.

It can also be seen from the tables shown in FIGS. 2(a) to 2(d) that, in the upper surface and bottom surface of the metal silicide layer of the p-channel MISFET and in the middle layer therebetween, Si and Pt are contained in substantially the same proportion and, in each of the metal silicide layers of the re-channel MISFETs, the ratio of Pt to Si decreases with increasing distance from the upper surface thereof toward the bottom surface thereof.

By thus performing the first heat treatment using the heat-conduction type anneal apparatus, not the microwave anneal apparatus, and performing the second heat treatment using the microwave anneal apparatus to form the metal silicide layers 41, it is possible to cause Pt in each of the metal silicide layers of the p-channel MISFET Qp to be segregated in a larger amount at the bottom surface (at the interface with the semiconductor substrate 1) of the metal silicide layer 41. Also, for the same reason, it is possible to cause Pt in each of the metal silicide layers 41 of the n-channel MISFET Qn to be segregated in a larger amount not at the bottom surface of the metal silicide layer 41, but at the upper surface thereof. This allows a reduction in the contact resistance between the metal silicide layer 41 and the semiconductor substrate 1 in each of the p-channel MISFET Qp and the n-channel MISFET Qn and therefore allows an improvement in the performance of the semiconductor device.

Next, manufacturing steps of the semiconductor device of the present embodiment will be described with reference to the drawings. FIGS. 3 to 10 are main-portion cross-sectional views of a semiconductor device as an embodiment of the present invention, e.g., a semiconductor device having a CMISFET (Complementary MISET).

Figure 3:
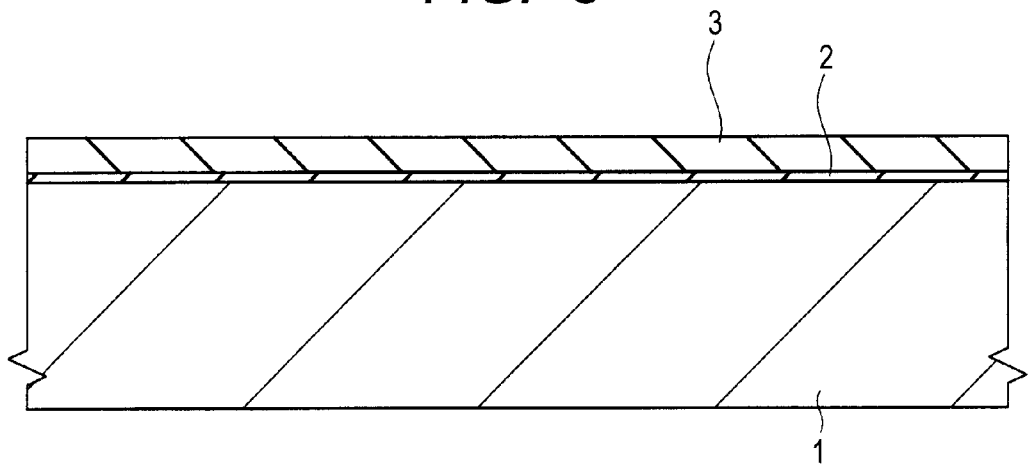
FIG. 3 is a main-portion cross-sectional view of the semiconductor device as the embodiment of the present invention during a manufacturing step.
Figure 4:
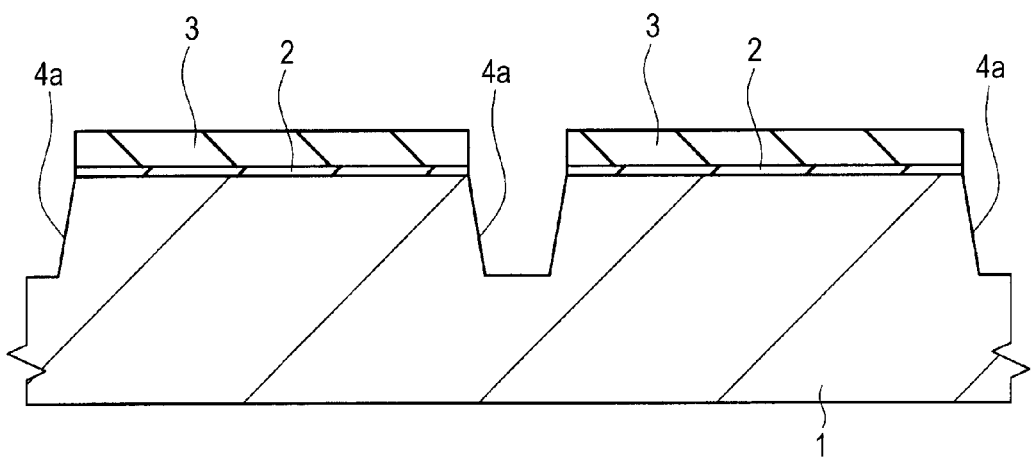
FIG. 4 is a main-portion cross-sectional view of the semiconductor device during a manufacturing step subsequent to that of FIG. 3.

First, as shown in FIG. 3, the semiconductor substrate (semiconductor wafer) 1 formed of p-type single-crystal silicon having a specific resistance of, e.g., about 1 to 10 Ωcm or the like is prepared. Then, the semiconductor substrate 1 is thermally oxidized to form an insulating film 2 having a thickness of, e.g., about 11 nm over the surface thereof. Thereafter, an upper-layer insulating film 3 having a thickness of, e.g., about 90 nm is deposited thereover by a CVD (Chemical Vapor Deposition) method or the like. The insulating film 2 is formed of a silicon oxide or the like, while the insulating film 3 is formed of a silicon nitride film or the like. Then, as shown in FIG. 4, using a photoresist pattern (not shown) as an etching mask, the insulating film 3, the insulating film 2, and the semiconductor substrate 1 are successively dry-etched to form trenches (trenches for isolation) 4a each having a depth of, e.g., about 300 nm in the semiconductor substrate 1 in regions where the isolations are to be formed. The trenches 4a are for isolation, i.e., for forming the isolation regions 4, which will be described later.

Figure 5:
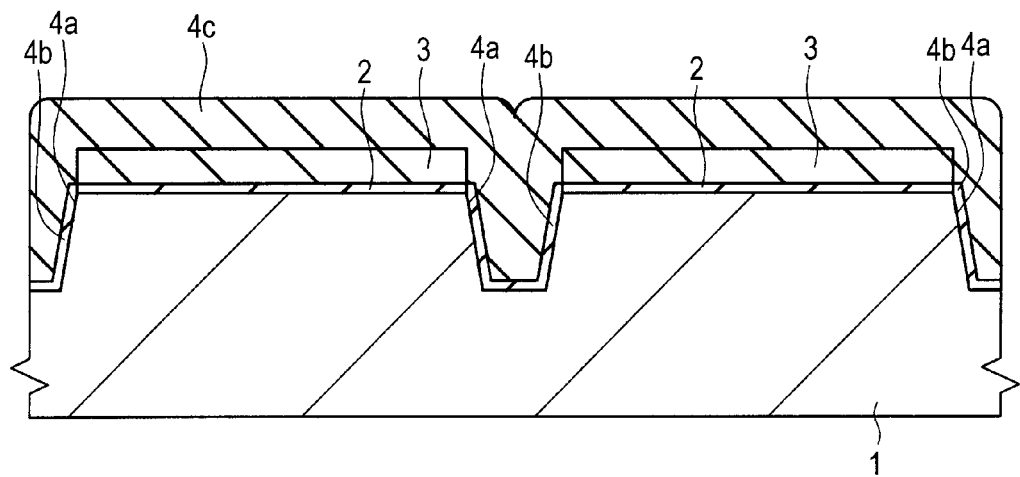
FIG. 5 is a main-portion cross-sectional view of the semiconductor device during a manufacturing step subsequent to that of FIG. 4.

Next, as shown in FIG. 5, an insulating film 4b having a thickness of, e.g., about 10 nm is formed over the main surface of the semiconductor substrate 1 including the insides (side walls and bottom portions) of the trenches 4a. Then, over the main surface of the semiconductor substrate 1, to fill up the trenches 4a, an insulating film 4c is formed (deposited) by a CVD method or the like.

The insulating film 4b is formed of a silicon oxide film or a silicon oxynitride film. When the insulating film 4b is the silicon oxynitride film, an effect is obtained which allows the prevention of volume expansion resulting from the oxidation of the side walls of the trenches 4a by a heat treatment subsequent to the step of forming the insulating film 4b and allows a reduction in compressive stress acting on the semiconductor substrate 1.

The insulating film 4c is a silicon oxide film deposited by a HDP-CVD (High Density Plasma CVD) method, an $O_3$-TEOS oxide film, or the like. Note that the $O_3$-TEOS oxide film is a silicon oxide film formed by a thermal CVD method using $O_3$ (ozone) and TEOS (Tetraethoxysilane or Tetra Ethyl Ortho Silicate) as a raw material gas (source gas).

Then, by subjecting the semiconductor substrate 1 to a heat treatment at, e.g., about 115° C.°, the insulating film 4c buried in the trenches 4a is baked. In a state prior to baking, the silicon oxide film deposited by the HDP-CVD method is denser than the $O_3$-TEOS oxide film. Therefore, when the insulating film 4c is the $O_3$-TEOS oxide film, the insulating film 4c shrinks due to baking to achieve the effect of allowing a reduction in the compressive stress acting on the semiconductor substrate 1. On the other hand, when the insulating film 4c is the silicon oxide film deposited by the HDP-CVD method, the shrinkage of the insulating film 4c during the baking is smaller in amount than when the insulating film 4c is the $O_3$-TEOS oxide film so that the compressive stress exerted on the semiconductor substrate 1 by the isolation regions 4 increases.

Figure 6:
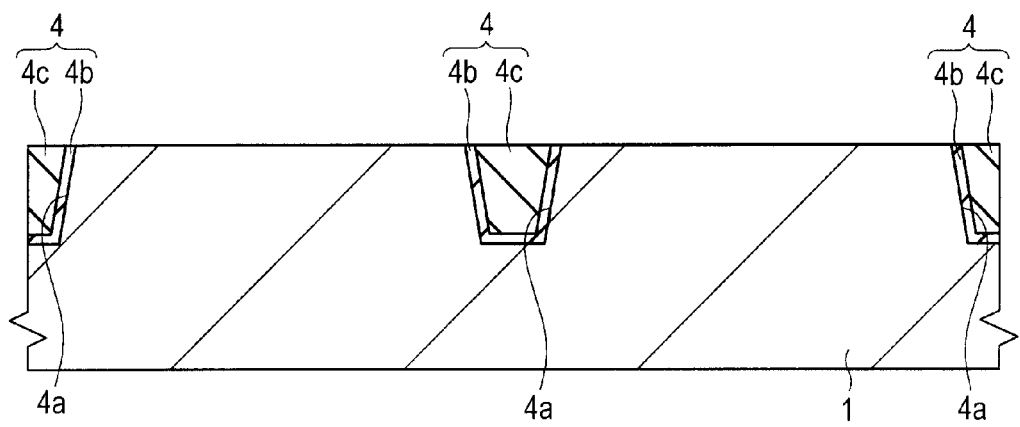
FIG. 6 is a main-portion cross-sectional view of the semiconductor device during a manufacturing step subsequent to that of FIG. 5.

Next, as shown in FIG. 6, the insulating film 4c is polished by a CMP (Chemical Mechanical Polishing) method to expose the insulating film 3. After the insulating film 3 is removed by wet etching using a hot phosphoric acid or the like, the insulating film 4c and the insulating film 2 outside the trenches 4a are removed using HF or the like to leave the insulating films 4b and 4c in the trenches 4a, thereby forming the isolation regions (isolations) 4.

In this manner, the isolation regions 4 formed of the insulating films 4b and 4c buried in the trenches 4a are formed. In the present embodiment, the isolation regions 4 are preferably formed not by a LOCOS (Local Oxidization of Silicon) method, but by a STI (Shallow Trench Isolation) method. That is, each of the isolation regions 4 of the present embodiment is preferably formed of an insulator (which is the insulating films 4b and 4c herein) buried in the trenches 4a for isolation formed in the semiconductor substrate 1. The n-channel MISFET Qn (i.e., the gate insulating film 7, the gate electrode 8a, and the n$^-$-type semiconductor regions 9a and the n$^+$-type semiconductor regions 9b for the source/drain regions each forming the re-channel MISFET Qn), which will be described later, is formed in an active region defined (surrounded) by the isolation region 4. Also, the p-channel MISFET Qp (i.e., the gate insulating film 7, the gate electrode 8b, and the p$^-$-type semiconductor regions 10a and the p$^+$-type semiconductor regions 10b for the source/drain regions each forming the p-channel MISFET Qp), which will be described later, is also formed in an active region defined (surrounded) by the isolation region 4.

Figure 7:
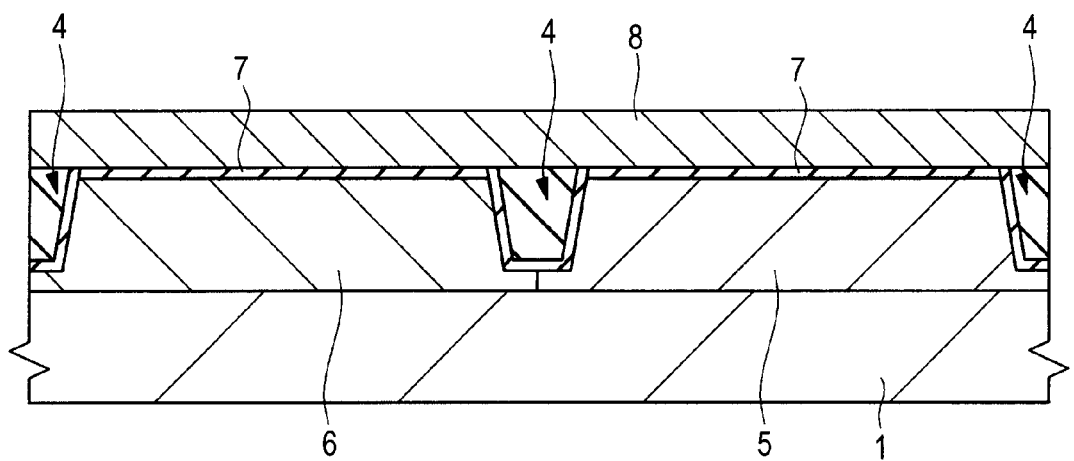
FIG. 7 is a main-portion cross-sectional view of the semiconductor device during a manufacturing step subsequent to that of FIG. 6.

Next, as shown in FIG. 7, the p-type well 5 and the n-type well 6 are each formed at a predetermined depth from the main surface of the semiconductor substrate 1. The p-type well 5 can be formed by, e.g., ion-implanting a p-type impurity such as boron (B) into the semiconductor substrate 1 in a region where the n-channel MISFET is to be formed using a photoresist film (not shown) covering a region where the p-channel MISFET is to be formed as an ion implantation stopping mask, and so forth. On the other hand, the n-type well 6 can be formed by, e.g., ion-implanting an n-type impurity such as phosphorus (P) or arsenic (As) into the semiconductor substrate 1 in the region where the p-channel MISFET is to be formed using another photoresist film (not shown) covering the region where the re-channel MISFET is to be formed as an ion implantation stopping mask, and so forth.

Next, by wet etching using, e.g., an aqueous hydrofluoric (HF) acid solution or the like, the surface of the semiconductor substrate 1 is purified (cleaned). Then, over the surface (i.e., the surfaces of the p-type well 5 and the n-type well 6) of the semiconductor substrate 1, the gate insulating film 7 is formed. The gate insulating film 7 is formed of, e.g., a thin silicon oxide film or the like, and can be formed by, e.g., a thermal oxidization method or the like.

Next, over the semiconductor substrate 1 (i.e., over the gate insulating film 7 of the p-type well 5 and the n-type well 6), as a conductive film for forming the gate electrodes, a silicon film 8 such as a polysilicon film is formed. Of the silicon film 8, the region where the n-channel MISFET is to be formed (region which is to serve as the gate electrode 8a described later) is changed to a low-resistance n-type semiconductor film (doped polysilicon film) by ion-implanting an n-type impurity such as phosphorus (P) or arsenic (As) using a photoresist film (not shown) as a mask, and so forth. Of the silicon film 8, the region where the p-channel MISFET is to be formed (region which is to serve as the gate electrode 8b described later) is changed to a low-resistance p-type semiconductor film (doped polysilicon film) by ion-implanting a p-type impurity such as boron (B) using another photoresist film (not shown) as a mask, and so forth. The silicon film 8 may also be formed by depositing an amorphous silicon film, and then changing the deposited amorphous silicon film into a polysilicon film by a heat treatment after film deposition (after ion implantation).

Figure 8:
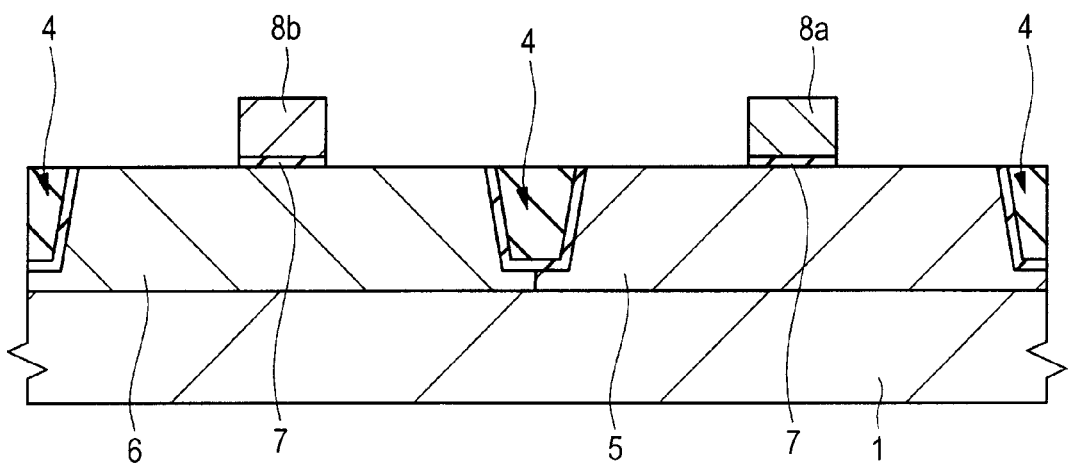
FIG. 8 is a main-portion cross-sectional view of the semiconductor device during a manufacturing step subsequent to that of FIG. 7.

Next, as shown in FIG. 8, the silicon film 8 is patterned using a photolithographic method and a dry etching method to form the gate electrodes 8a and 8b.

The gate electrode 8a serving as the gate electrode of the n-channel MISFET is formed of polysilicon (an n-type semiconductor film or a doped polysilicon film) into which an n-type impurity has been introduced, and formed over the p-type well 5 via the gate insulating film 7. That is, the gate electrode 8a is formed over the gate insulating film 7 of the p-type well 5. On the other hand, the gate electrode 8b serving as the gate electrode of the p-channel MISFET is formed of polysilicon (a p-type semiconductor film or a doped polysilicon film) into which a p-type impurity has been introduced, and formed over the n-type well 6 via the gate insulating film 7. That is, the gate electrode 8b is formed over the gate insulating film 7 of the n-type well 6. The gate lengths of the gate electrodes 8a and 8b can be changed as necessary to, e.g., about 50 nm.

Figure 9:
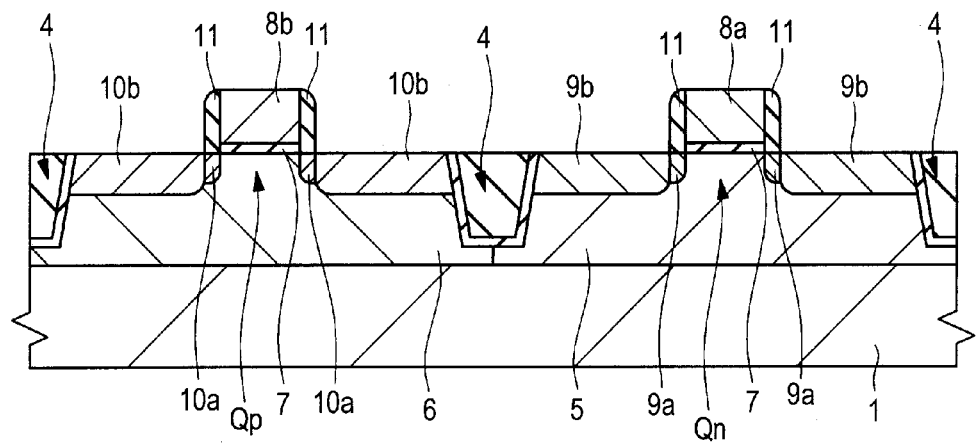
FIG. 9 is a main-portion cross-sectional view of the semiconductor device during a manufacturing step subsequent to that of FIG. 8.

Next, as shown in FIG. 9, into the regions of the p-type well 5 located on both sides of the gate electrode 8a, an n-type impurity such as phosphorus (P) or arsenic (As) is ion-implanted to form the (pair of) n$^-$-type semiconductor regions 9a. Also, into the regions of the n-type well 6 located on both sides of the gate electrode 8b, a p-type impurity such as boron (B) is ion-implanted to form the (pair of) p$^-$-type semiconductor regions 10a. The depths (junction depths) of the n$^-$-type semiconductor regions 9a and the p$^-$-type semiconductor regions 10a can be set to, e.g., about 30 nm.

Next, over the side walls of the gate electrodes 8a and 8b, the sidewall spacers or sidewalls (side-wall insulating films) each formed of, e.g., silicon oxide, silicon nitride, a laminate film of the insulating films thereof, or the like are formed as insulating films. The sidewalls 11 can be formed by, e.g., depositing a silicon oxide film, a silicon nitride film, or a laminate film thereof over the semiconductor substrate 1 and anisotropically etching the silicon oxide film, the silicon nitride film, or the laminate film thereof by an RIE (Reactive Ion Etching) method or the like.

After the formation of the sidewalls 11, the (pair of) n$^+$-type semiconductor regions 9b (source/drain regions) are formed by ion-implanting an n-type impurity such as phosphorus (P) or arsenic (As) into the regions of the p-type well 5 located on both sides of the gate electrode 8a and the sidewalls 11. For example, phosphorus (P) is implanted at about $5 \times 10^{15}/\text{cm}^2$ or arsenic (As) is implanted at about $4 \times 10^{15}/\text{cm}^2$ to form the n$^+$-type semiconductor regions 9b. Also, the (pair of) p$^+$-type semiconductor regions 10b (source/drain regions) are formed by ion-implanting a p-type impurity such as boron (B) into the regions of the n-type well 6 located on both sides of the gate electrode 8b and the sidewalls 11. For example, boron (B) is implanted at about $4 \times 10^{15}/\text{cm}^2$ to form the p$^+$-type semiconductor regions 10b. Either the n$^+$-type semiconductor regions 9b or the p$^+$-type semiconductor regions 10b may be formed first. After the ion implantations, an anneal treatment for activating the introduced impurities can also be performed as a heat treatment (spike anneal treatment) at, e.g., about 1050° C. for about 5 seconds. The depths (junction depths) of the n$^+$-type semiconductor regions 9b and the p$^+$-type semiconductor regions 10b can be set to, e.g., about 80 nm.

The n$^+$-type semiconductor regions 9b have impurity concentrations higher than those of the n$^-$-type semiconductor regions 9a. Also, the p$^+$-type semiconductor regions 10b have impurity concentrations higher than those of the p$^-$-type semiconductor regions 10a. As a result, an n-type semiconductor region (impurity diffusion layer) functioning as the source or drain region of the n-channel MISFET is formed of the n$^+$-type semiconductor region (impurity diffusion layer) 9b and the n$^-$-type semiconductor region 9a, and a p-type semiconductor region (impurity diffusion layer) functioning as the source or drain region of the p-channel MISFET is formed of the p$^+$-type semiconductor region (impurity diffusion layer) 10b and the p$^-$-type semiconductor region 10a. Therefore, the source/drain regions of the n-channel MISFET and the p-channel MISFET have LDD (Lightly doped Drain) structures. The n$^-$-type semiconductor regions 9a are formed by self-alignment with respect to the gate electrode 8a, while the n$^+$-type semiconductor regions 9b are formed by self-alignment with respect to the sidewalls 11 formed over the side walls of the gate electrode 8a. The p$^-$-type semiconductor regions 10a are formed by self-alignment with respect to the gate electrode 8b, while the p$^+$-type semiconductor regions 10b are formed by self-alignment with respect to the sidewalls 11 formed over the side walls of the gate electrode 8b.

Thus, in the p-type well 5, the n-channel MISFET Qn is formed as the field effect transistor while, in the n-type well 6, the p-channel MISFET Qp is formed as the field effect transistor. In this manner, the structure of FIG. 9 is obtained. The n-channel MISFET Qn can be regarded as the n-channel field effect transistor, while the p-channel MISFET Qp can be regarded as the p-channel field effect transistor. Also, the n$^+$-type semiconductor region 9b can be regarded as the semiconductor region for the source or drain region of the n-channel MISFET Qn, while the p$^+$-type semiconductor region 10b can be regarded as the semiconductor region for the source or drain region of the p-channel MISFET Qp.

Next, using a Salicide (Self Aligned Silicide) technique, over the surfaces of the gate electrode 8a and the source/drain regions (which are the n$^+$-type semiconductor regions 9b herein) of the n-channel MISFET Qn and over the surfaces of the gate electrode 8b and the source/drain regions (which are the p$^+$-type semiconductor regions 10b herein) of the p-channel MISFET Qp, low-resistance metal silicide layers (corresponding to the metal silicide layers 41 described later) are formed. As the salicide process in the present embodiment, a salicide process according to a partial reaction method is used. Hereinbelow, the step of forming the metal silicide layers will be described.

Figure 10:
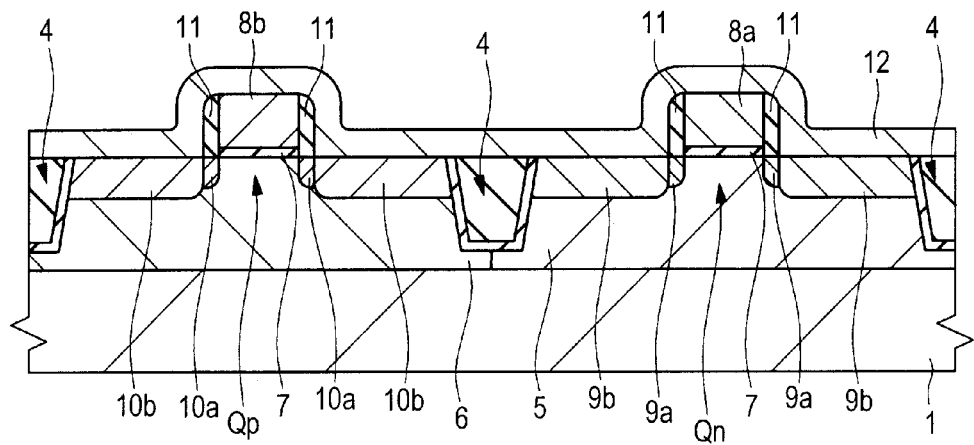
FIG. 10 is a main-portion cross-sectional view of the semiconductor device during a manufacturing step subsequent to that of FIG. 9.

FIG. 10 is a main-portion cross-sectional view of the semiconductor device during a manufacturing step subsequent to that of FIG. 9. FIGS. 11, 12, and 21 to 23 are main-portion cross-sectional views of the semiconductor device during manufacturing steps subsequent to that of FIG. 10.

After the structure of FIG. 9 is obtained as described above, as shown in FIG. 10, the surfaces of the gate electrodes 8a and 8b, the n$^+$-type semiconductor regions 9b, and the p$^+$-type semiconductor regions 10b are exposed. Then, over the main surface (entire surface) of the semiconductor substrate 1 including the gate electrodes 8a and 8b, the n$^+$-type semiconductor regions 9b, and the p$^+$-type semiconductor regions 10b, a metal film 12 is formed (deposited) using, e.g., a sputtering method. That is, over the semiconductor substrate 1 including the n$^+$-type semiconductor regions 9b and the p$^+$-type semiconductor regions 10b, the metal film 12 is formed so as to cover the gate electrodes 8a and 8b.

More preferably, prior to the step of depositing the metal film 12, a dry cleaning treatment using at least one of NF gas, NF$_3$ gas, NH$_3$ gas, and H$_2$ gas is performed to remove natural oxide films in the surfaces of the gate electrodes 8a and 8b, the n$^+$-type semiconductor regions 9b, and the p$^+$-type semiconductor regions 10b, and then the step of depositing the metal film 12 is performed without exposing the semiconductor substrate 1 to an atmosphere (oxygen-containing atmosphere).

The metal film 12 is formed of, e.g., a nickel-platinum (Ni—Pt) alloy film (alloy film of Ni and Pt), and the thickness (deposited film thickness) thereof can be set to, e.g., about 15 to 40 nm. Here, the concentration of Pt (platinum) in the metal film 12 is set to, e.g., 3 to 10 at %.

Figure 11:
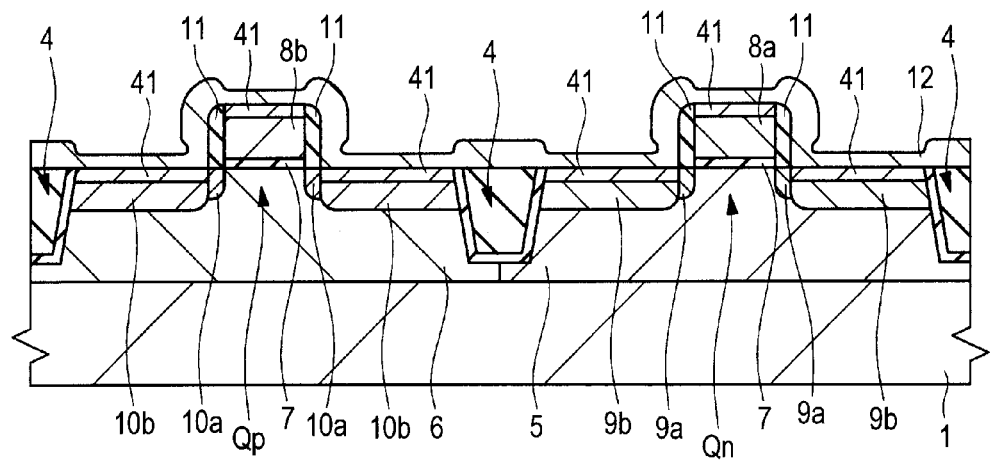
FIG. 11 is a main-portion cross-sectional view of the semiconductor device during a manufacturing step subsequent to that of FIG. 10.

After the metal film 12 is thus formed, as shown in FIG. 11, the semiconductor substrate 1 is subjected to a first heat treatment (1st anneal treatment). Here, the first heat treatment is preferably performed at 250 C.° to 300 C.°. For example, by subjecting the semiconductor substrate 1 to a heat treatment of not more than 30 seconds at a temperature of about 260° C. in an inert gas atmosphere or a nitrogen gas atmosphere using a single-wafer heat-conduction type anneal apparatus described later and an RTA (Rapid Thermal Anneal) method, the first heat treatment can be performed. The reason for setting the time of the first heat treatment to a period of not more than 30 seconds is that, when the heat treatment is performed for a period longer than 30 seconds, the reaction between the metal film 12 and the semiconductor substrate 1 excessively proceeds to undesirably increase the film thicknesses of the formed metal silicide layers 41.

By the first heat treatment, as shown in FIG. 11, selective reaction is caused between the polysilicon film forming the gate electrodes 8a and 8b and the metal film 12 and between the single-crystal silicon forming each of the n$^+$-type semiconductor regions 9b and the p$^+$-type semiconductor regions 10b and the metal film 12 to form the metal silicide layers 41 as metal-semiconductor reaction layers. At this time, in a Ni—Pt alloy film in the metal film 12, a Ni—Pt alloy in the range of 5 to 7 nm measured from the bottom surface thereof in contact with the semiconductor substrate 1 (the upper portion of each of the gate electrodes 8a and 8b, the n$^+$-type semiconductor regions, 9b and the p$^+$-type semiconductor regions 10b) toward the opposite upper surface thereof reacts with the upper portion of each of the gate electrodes 8a and 8b, the n$^+$-type semiconductor regions 9b, and the p$^+$-type semiconductor regions 10b. As a result, in the upper portion of each of the gate electrodes 8a and 8b, the n$^+$-type semiconductor regions 9b, and the p$^+$-type semiconductor regions 10b, the metal silicide layers 41 which are in a metal-rich phase containing Pt and Ni$_2$Si (dinickel silicide) and have microcrystals (serving as cores of crystals) of NiSi (nickel monosilicide) formed therein are formed. Note that the metal-rich phase mentioned herein indicates a phase formed of a compound in which numerous metal atoms are combined with each Si atom, such as Ni$_2$Si or Ni$_3$Si, unlike a compound in which Si atoms and metal atoms are combined at a ratio of 1:1, such as NiSi. Conversely, NiSi$_2$ in which numerous Si atoms are combined with each metal atom or the like is assumed to be in a silicon-rich phase.

That is, the metal film 12 formed to a thickness of 15 to 40 nm over the semiconductor substrate 1 in the step shown in FIG. 10 partially reacts with the respective upper portions of the gate electrodes 8a and 8b, the n$^+$-type semiconductor regions 9b, and the p$^+$-type semiconductor regions 10b to form the metal silicide layers 41 shown in FIG. 11 in the first heat treatment. The reacted part of the metal film 12 over the upper portion of each of the gate electrodes 8a and 8b, the n$^+$-type semiconductor regions 9b, and the p$^+$-type semiconductor regions 10b corresponds to a part of the entire thickness of the metal film 12. Accordingly, as shown in FIG. 11, the metal film 12 over the semiconductor substrate 1 from which the metal silicide layers 41 have been formed is thinner over the upper portion of each of the gate electrodes 8a and 8b, the n$^+$-type semiconductor regions 9b, and the p$^+$-type semiconductor regions 10b than the metal film 12 in the other region. The salicide process in which the metal film 12 corresponding to a part of the thickness thereof is caused to react only in a required amount to form the metal silicide layers 41 is called herein the salicide process according to the partial reaction method.

Note that Pt has been added into the metal film 12 in the present embodiment. This is because, when nickel silicide layers are used as the metal silicide layers, by adding Pt into the nickel silicide layers (metal silicide layers 41), it is possible to reduce the agglomeration of the formed metal silicide layers and suppress abnormal growth of NiSi$_2$ crystals in the formed metal silicide layers. In addition, by adding Pt into the metal film 12, crystals of NiSi having smaller crystal grain diameters are more likely to be formed in the metal silicide layers 41 formed by the first heat treatment As described above, the first heat treatment of the present embodiment uses not a salicide process according to a whole reaction method in which the entire metal film 12 formed over the semiconductor substrate 1 is caused to react with the respective upper portions of the gate electrodes 8a and 8b, the n$^+$-type semiconductor regions 9b, and the p$^+$-type semiconductor regions 10b, but the salicide process according to the partial reaction method in which the metal film 12 corresponding to only a part of the thickness thereof is caused to react only in a required amount to form the metal silicide layers 41.

In the salicide process according to the whole reaction method, the thickness of the metal film 12 formed before the first heat treatment is used to control an amount of reaction (thicknesses of the metal silicide layers 41) between the metal film 12 and the gate electrodes 8a and 8b, the n$^+$-type semiconductor regions 9b, and the p$^+$-type semiconductor regions 10b. By contrast, in the salicide process according to the partial reaction method used in the present embodiment, using the temperature at which the semiconductor substrate 1 is heated in the first heat treatment and the time of the heating, it is possible to control an amount of reaction (thicknesses of the metal silicide layers 41) between the metal film 12 and the gate electrodes 8a and 8b, the n$^+$-type semiconductor regions 9b, and the p$^+$-type semiconductor regions 10b. Therefore, the salicide process according to the partial reaction method has the characteristic feature of easier formation of a silicide layer having a small thickness of not more than 14 nm than in the salicide process according to the whole reaction method.

Figure 12:
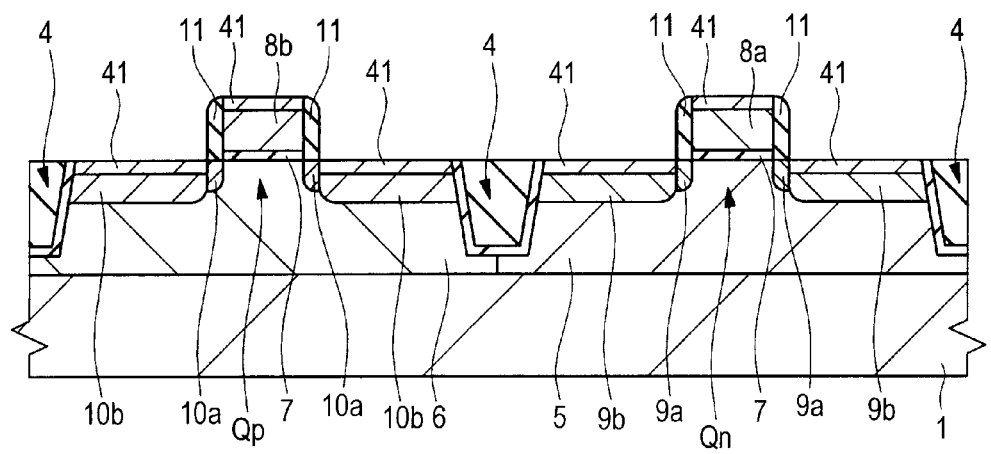
FIG. 12 is a main-portion cross-sectional view of the semiconductor device during a manufacturing step subsequent to that of FIG. 11.

Next, as shown in FIG. 12, by performing a wet cleaning treatment, the unreacted metal film 12 (i.e., the metal film 12 which has not reacted with the gate electrodes 8a and 8b, the n$^+$-type semiconductor regions 9b, and the p$^+$-type semiconductor regions 10b) is removed. At this time, the metal silicide layers 41 are left over the respective surfaces of the gate electrodes 8a and 8b, the n$^+$-type semiconductor regions 9b, and the p$^+$-type semiconductor regions 10b. The wet cleaning treatment can be formed by wet cleaning using sulfuric acid, wet cleaning using SPM (Sulfuric acid Hydrogen Peroxide mixture, which is a mixed solution of sulfuric acid and aqueous hydrogen peroxide), or the like.

Then, the semiconductor substrate 1 is subjected to the second heat treatment (2nd anneal treatment). The second heat treatment is performed at a heat treatment temperature of substantially the same level as that of the heat treatment temperature of the foregoing first heat treatment. For example, by irradiating the semiconductor substrate 1 with a microwave of 5.8 GHz in an inert gas or nitrogen gas atmosphere and subjecting the semiconductor substrate 1 to a heat treatment of about 60 seconds to 120 seconds at about 200° C. to 300° C., the second heat treatment can be performed. It is assumed that, at this time, the power of the microwave is set to be not less than 800 W and not more than 2000 W and the irradiation is performed with a power of, e.g., 1500 W. In the present embodiment, the first heat treatment is performed using the single-wafer heat-conduction type anneal apparatus, but the second heat treatment is performed using a microwave anneal apparatus. Note that the microwave anneal apparatus may be a single-wafer type or a batch type.

By performing the second heat treatment, the entire metal silicide layer 41 mainly containing the metal-rich phase formed of Ni$_2$Si or Ni$_3$Si can be phase-transformed into a NiSi phase. At this time, the metal-rich phase formed of Ni$_2$Si formed in the first heat treatment is decomposed first, and then phase-transformed into NiSi. Note that NiSi has a resistivity lower than that of each of Ni$_2$Si and Ni$_3$Si and, even after the second heat treatment (until the end of the manufacturing of the semiconductor device), the metal silicide layers 41 are maintained in low-resistance NiSi. In the manufactured semiconductor device (even in a state where, e.g., the semiconductor substrate 1 has been singulated into individual semiconductor chips), the metal silicide layers 41 are in low-resistance NiSi.

In the present embodiment in which the metal silicide layers 41 each having a film thickness of about 14 nm are formed, the average grain diameter of NiSi in the metal silicide layers 41 after the second heat treatment is not more than 100 nm in the n-channel MISFET Qn and not more than 200 nm in the p-channel MISFET Qp. That is, since the average grain diameter of microcrystals of NiSi formed in the metal silicide layers 41 of the present embodiment is about 20 to 30 nm, the crystal grain diameter of NiSi formed by the first heat treatment is not more than one third of the crystal grain diameter of NiSi after the second heat treatment. Note that the crystal grain diameter mentioned herein is the diameter of a crystal in a direction along the main surface of the semiconductor substrate 1.

Here, the single-wafer heat-conduction type anneal apparatus used in the first heat treatment of the present embodiment will be described using FIGS. 13 to 16. The heat-conduction type anneal apparatus shown in FIGS. 13 to 16 is of a single-wafer type so that, unlike in a batch type anneal apparatus in which a plurality of semiconductor wafers are simultaneously annealed in one furnace, semiconductor wafers are individually placed one-by-one in one anneal furnace of the anneal apparatus and subjected to a heat treatment.

Figure 13:
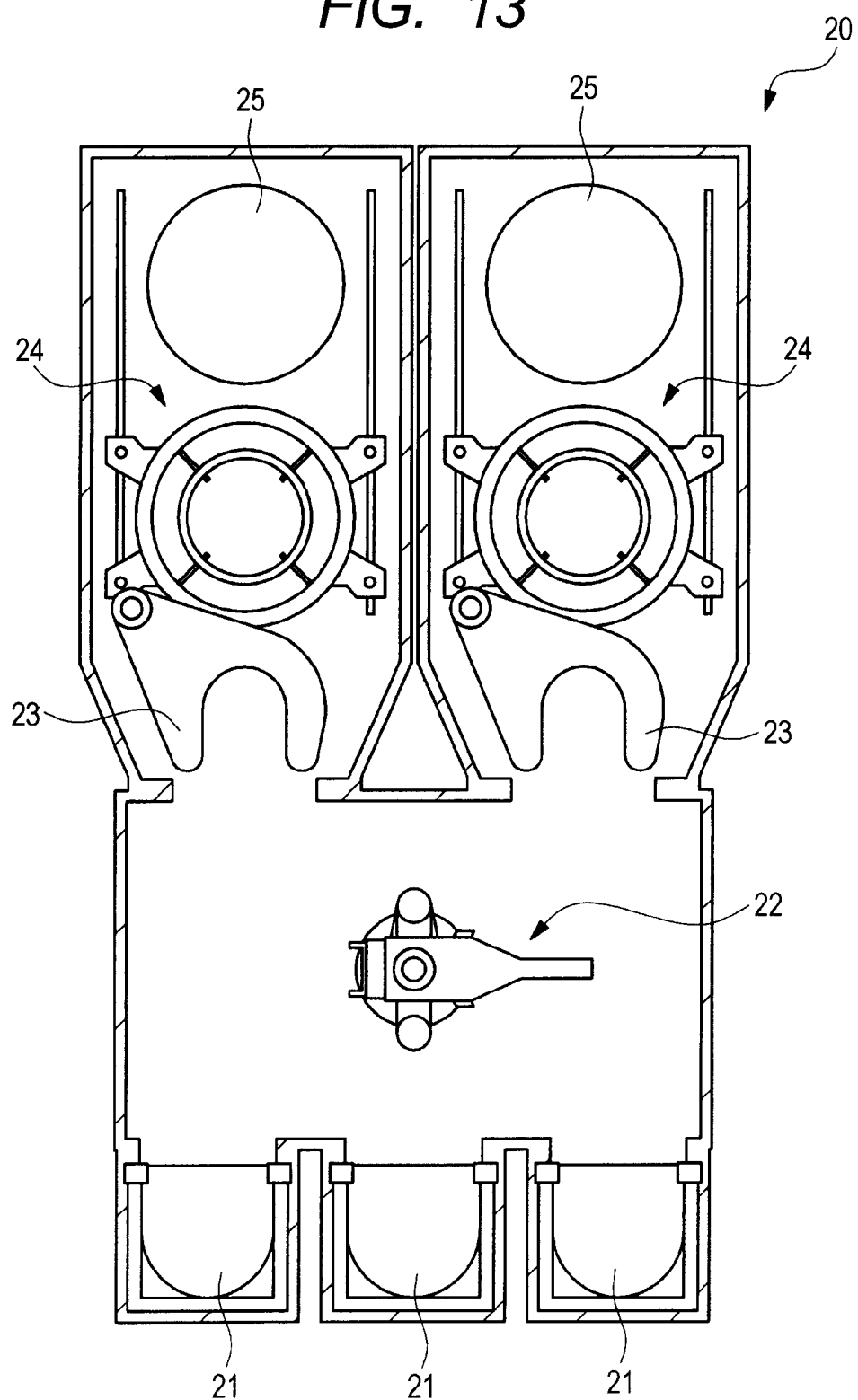
FIG. 13 is a plan view showing a part of a heat-conduction type anneal apparatus in the embodiment of the present invention in cut-away relation.

FIG. 13 is a plan view showing a main portion of a heat-conduction type anneal apparatus by cutting away a part thereof. A heat-conduction type anneal apparatus 20 includes load ports for transporting semiconductor wafers into the heat-conduction type anneal apparatus 20, a robot arm 22, swappers 23, and carrier plates 24 each for moving the semiconductor wafers in the heat-conduction type anneal apparatus 20, and reactors 25 for heating the semiconductor wafers. In the step of performing a heat treatment using the heat-conduction type anneal apparatus 20, the semiconductor wafers are first carried into the heat-conduction type anneal apparatus 20 by the load ports and then moved by the robot arm 22 from over the load ports onto the swappers 23 including two opposing plates. Then, the semiconductor wafers are placed by the swappers 23 onto the carrier plates 24. The carrier plates 24 having the semiconductor wafer mounted thereon move between the individual reactors 25 including two carbon heaters. Thereafter, the semiconductor wafers are subjected to heat treatments by the reactors 25, subsequently cooled over the carrier plates 24, returned onto the load ports 21 by the carrier plates 24, the swappers 23, and the robot arm 22 according to a procedure reverse to the transportation procedure described above, and then carried out of the heat-conduction type anneal apparatus 20 by the load ports 21.

Figure 14:
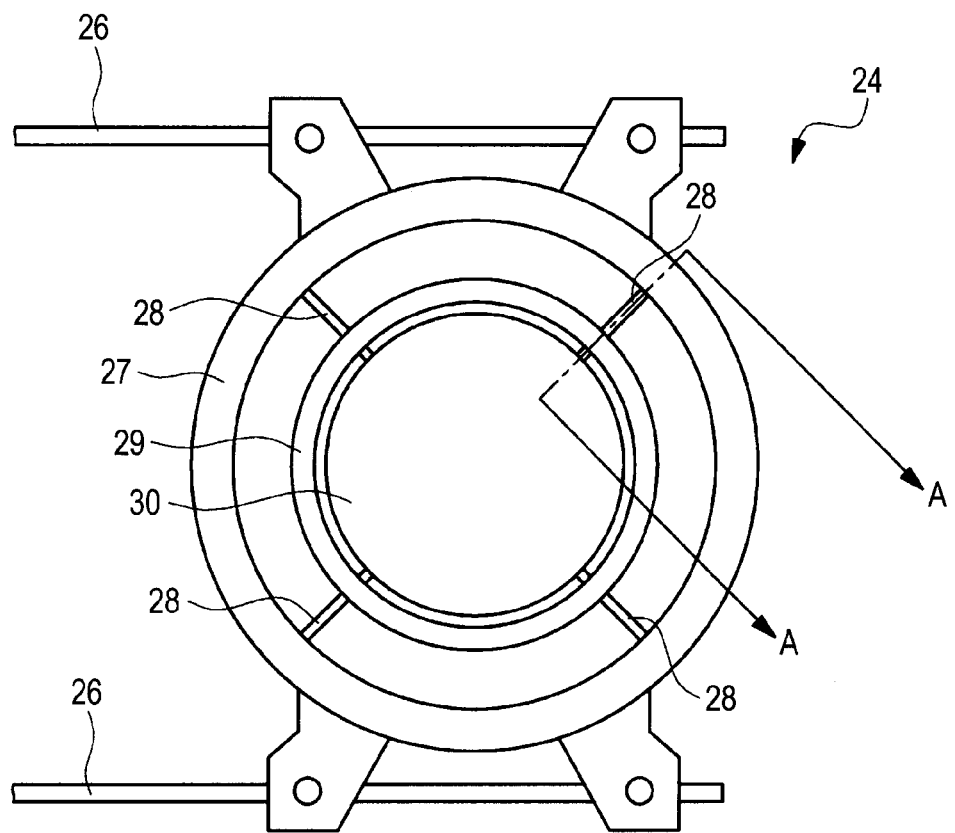
FIG. 14 is a plan view showing a part of the heat-conductive type anneal apparatus in the embodiment of the present invention.
Figure 15:
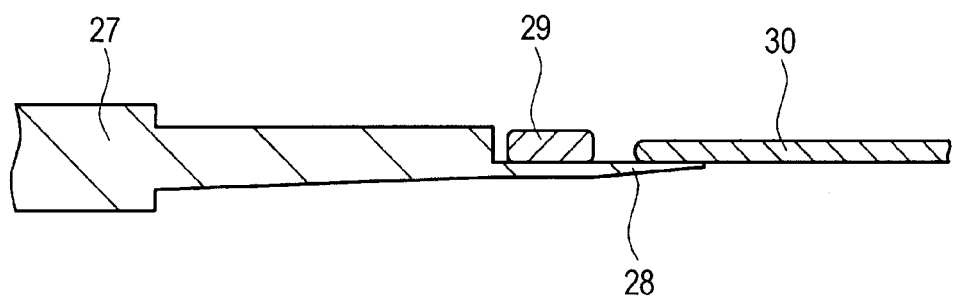
FIG. 15 is a cross-sectional view along the line A-A of FIG. 14.

Here, a plan view showing each of the carrier plates 24 in enlarged relation is shown in FIG. 14. In addition, the cross-sectional view of the carrier plate 24 along the line A-A of FIG. 14 is shown in FIG. 15. As shown in FIGS. 14 and 15, the carrier plate 24 is a circular plate capable of slidably moving along two bars 26, and has an outer carbon ring 27, support pins 28 each extending from the carbon ring 27 toward the center of the carrier plate 24, and a guard ring 29 placed over the support pins 28 and inward of the carbon ring 27 in the carrier plate. When a semiconductor wafer 30 is transported and subjected to a heat treatment, the semiconductor wafer 30 is placed over the support pins inward of the guard ring 29. Here, the guard ring 29 functions as a wall for preventing the displacement of the semiconductor wafer 30 and preventing lateral heat dissipation from the semiconductor wafer 30 so as to efficiently heat the semiconductor wafer.

Figure 16:
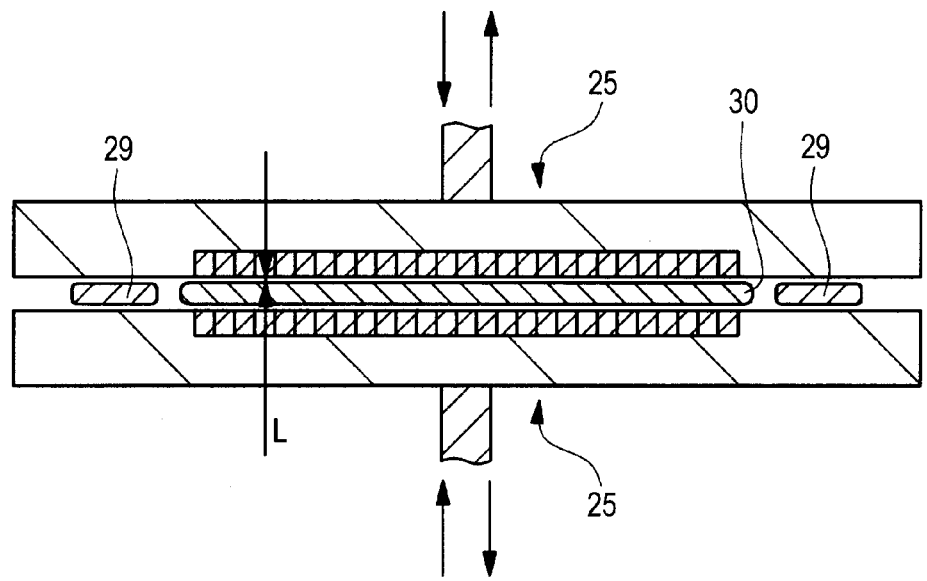
FIG. 16 is a cross-sectional view showing a part of the heat-conduction type anneal apparatus in the embodiment of the present invention.

As shown in FIG. 16, the heat-conduction type anneal apparatus 20 used in the present embodiment has the carbon heaters (reactors 25) which are two vertically movable conductors. When a heat treatment is performed, in a N$_2$ (nitrogen) atmosphere, the semiconductor wafer 30 held (chuck-held) in non-contact relation by the carrier plate 24 (not shown) using a Bernoulli chuck is vertically sandwiched between the two reactors 25 (from the main surface side and back surface side of the semiconductor wafer 30) so that the reactors 25 are located in the vicinity of the main surface and back surface of the semiconductor wafer 30. The reactors 25 are caused to generate heat with an electric current to heat the semiconductor wafer 30, thereby performing the heat treatment. That is, the two reactors 25 are movable in a vertical direction perpendicular to the main surface of the semiconductor wafer 30 placed over the carrier plate 24 in the heat-conduction type anneal apparatus 20. After the semiconductor wafer 30 is placed between the two reactors 25, the reactors 25 are brought closer to the main surface and back surface of the semiconductor wafer 30, respectively, to perform the heat treatment.

In the heat-conduction type anneal apparatus 20, the reactors 25 are vertically movable to come closer to the main surface and back surface of the semiconductor wafer 30, respectively. This allows a distance L between the main surface of the semiconductor wafer 30 shown in FIG. 16 and the reactor 25 opposing the main surface of the semiconductor wafer 30 to approach a value of about 150 μm and also similarly allows the distance between the back surface of the semiconductor wafer 30 and the opposing reactor 25 to approach a value of about 150 μm. By causing the reactors 25 and the semiconductor wafer 30 to maximally approach each other, it is possible to heat the semiconductor wafer 30 at a high temperature rise rate from the time when the heating of the semiconductor wafer 30 is started.

In addition, since the semiconductor wafer 30 is placed between the two reactors 25 in proximate relation thereto, the temperature of the reactors 25 can be regarded as the temperature of the semiconductor wafer 30. Therefore, in the heat-conduction type anneal apparatus 20, the temperature of the semiconductor wafer 30 is not measured. The temperature of the semiconductor wafer 30 is controlled by assuming that the semiconductor wafer 30 has the same temperature as that of the reactors 25 calculated from a value of a current allowed to flow in the reactors 25 or the like. Note that, in the first heat treatment, the metal film 12 (see FIG. 11) and the metal silicide layers 41 (see FIG. 11), each containing Ni (nickel) or Pt (platinum) and having a heat conductivity higher than that of the semiconductor substrate 1 (see FIG. 11) mainly formed of Si (silicon), have temperatures higher than that of the semiconductor substrate 1. That is, in the first heat treatment using the heat-conduction type anneal apparatus, each of the metal silicide layers 41 has a temperature higher than that of the semiconductor substrate 1.

Moreover, since the heat-conduction type anneal apparatus 20 is a compact single-wafer type anneal apparatus, the reactors 25 therein can be held in a heat generating state and the semiconductor wafer 30 can be carried in/out between the high-temperature reactors 25. Therefore, when the heat treatment is performed, it is possible to save a time till the reactors 25 reach a desired temperature for heating the semiconductor wafer 30 and rapidly heat the semiconductor wafer 30 from the time when it is placed between the reactors 25. Furthermore, by bringing the uniformly heated reactors 25 closer to the semiconductor wafer 30 and performing the heat treatment, the main surface and back surface of the semiconductor wafer 30 can be uniformly heated.

The heat-conduction type anneal apparatus 20 is characterized in that, when the semiconductor wafer 30 is heated, an overshoot does not occur in the temperature of the semiconductor wafer 30. That is, when the target temperature of the first heat treatment is assumed to be, e.g., 260° C., the heating of the semiconductor wafer 30 is started and, even after the temperature of the semiconductor wafer 30 reaches 260° C. as the target temperature, soak annealing can be performed at a constant temperature for a desired time without allowing the temperature of the semiconductor wafer 30 to rise over 260° C. Note that the soak annealing mentioned herein indicates performing a heat treatment at a substantially constant temperature for a relatively long time of not less than 30 seconds or the like. This is because the heating of the semiconductor wafer 30 is started in a state where the reactors 25 for heating the semiconductor wafer 30 are held in advance at the same temperature as the target temperature of the heat treatment of the semiconductor wafer 30, and the temperature of the reactors 25 does not rise over the target temperature during the heat treatment. Therefore, in the heat-conduction type anneal apparatus 20, it is possible to accurately control the temperature of the semiconductor wafer 30. Since there is no extra heating time, it is possible to prevent the crystal grain diameter of NiSi in the metal silicide layers 41 shown in FIG. 11 from increasing and form NiSi in the state of microcrystals having a crystal grain diameter of about 20 to 30 nm in the metal silicide layers 41.

Figure 17:
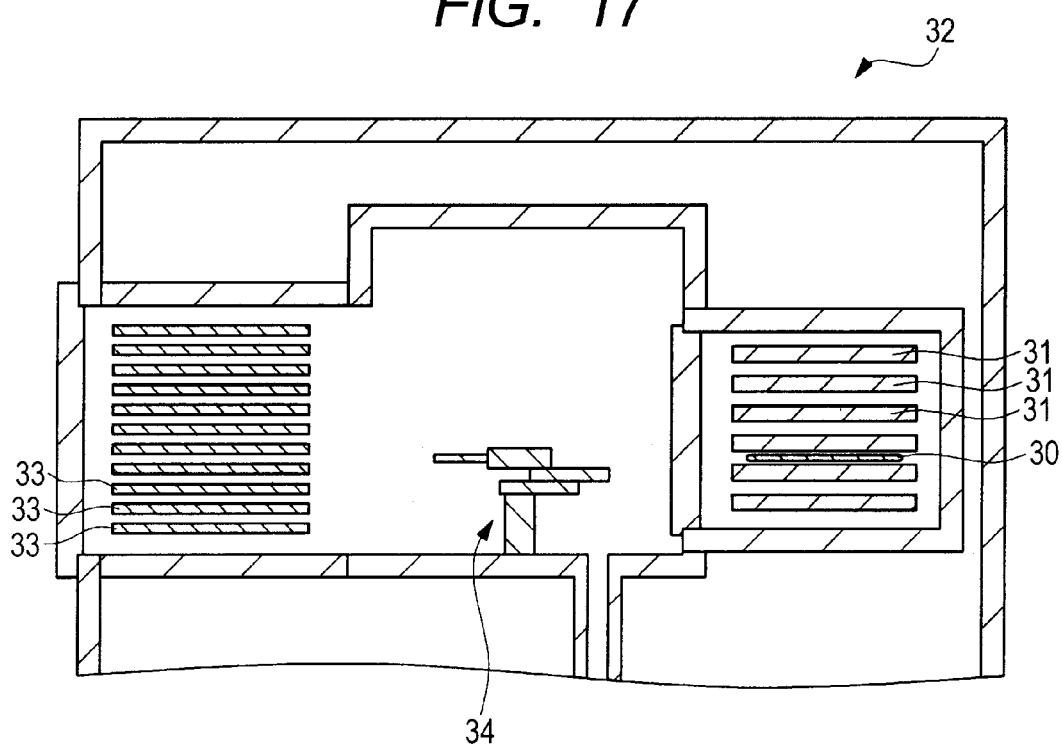
FIG. 17 is a cross-sectional view showing the heat-conduction type anneal apparatus.

Note that, in the present embodiment, the heat-conduction type anneal apparatus 20 is used which sandwiches the semiconductor wafer 30 between the two movable-type reactors 25 and performs a heat treatment on the semiconductor wafer 30 at an extremely close range. However, it is also possible to use a heat-conduction type anneal apparatus 32 which is similarly a single-wafer heat-conduction type anneal apparatus and includes a plurality of fixed heaters 31 fixed in the apparatus as shown in FIG. 17. FIG. 17 is a cross-sectional view of the heat-conduction type anneal apparatus 32. The heat-conduction type anneal apparatus 32 has a plurality of cooling plates 33, a robot arm 34, and the fixed heaters 31 in the inside thereof. Note that the heat-conduction type anneal apparatus 32 is internally held in an $N_2$ atmosphere by a chamber (not shown).

When a heat treatment is performed, the semiconductor wafer 30 is first introduced into the heat-conduction type anneal apparatus 32 from the outside thereof to be placed between the cooling plates 33. Then, the semiconductor wafer 30 is disposed between the fixed heaters 31 by the robot arm 34 and subjected to a heat treatment using the fixed heaters 31. Thereafter, the semiconductor wafer 30 is moved by the robot arm from between the fixed heaters 31 to between the cooling plates 33 and cooled using the cooling plates. Then, the semiconductor wafer 30 is retrieved from over the cooling plates to the outside of the heat-conduction type anneal apparatus 32. Note that the fixed heaters 31 shown in FIG. 17 are mainly formed of, e.g., aluminum and generate heat by resistive heating (Joule heating).

Figure 18:
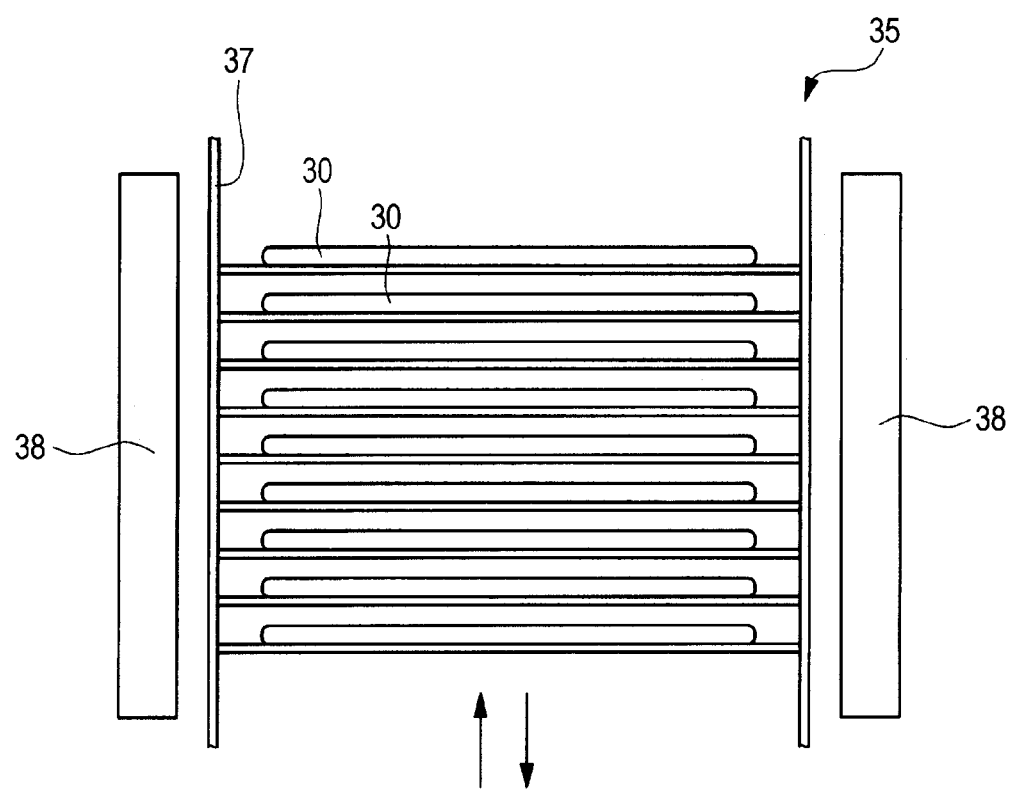
FIG. 18 is a cross-sectional view showing a batch type anneal apparatus as a comparative example.
Figure 19:
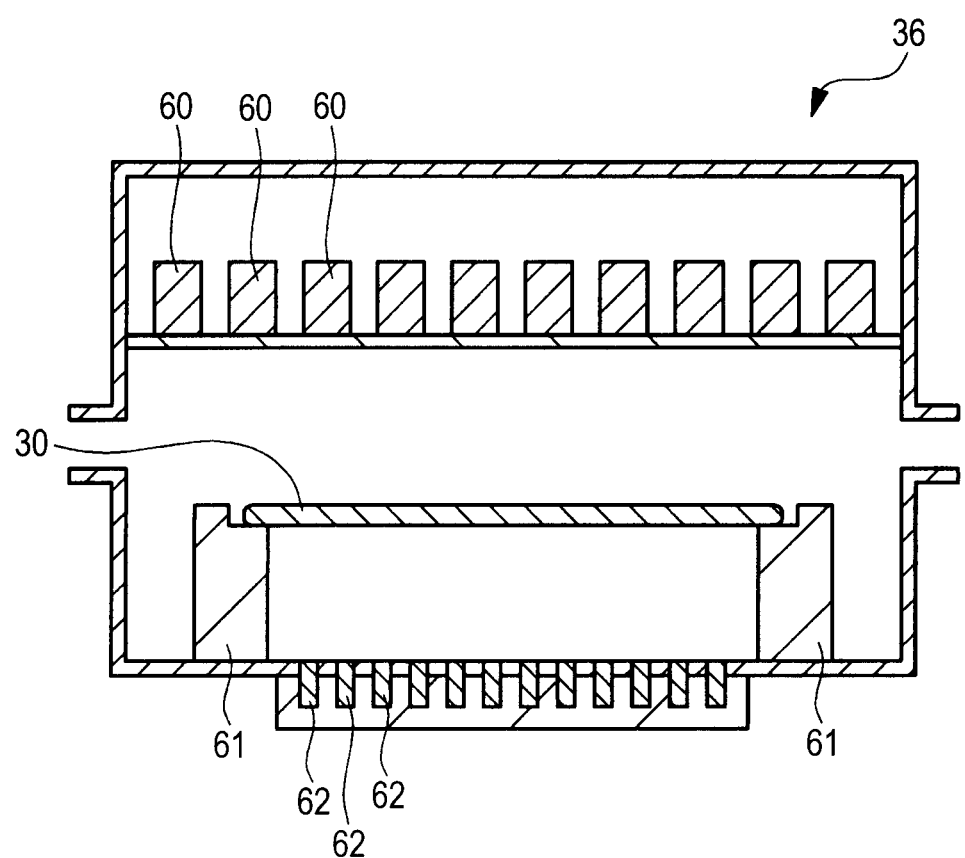
FIG. 19 is a cross-sectional view showing a lamp type anneal apparatus as another comparative example.

Note that, in the first heat treatment, it is not intended to extrude the use of a batch type anneal apparatus 35 which is the heat-conduction type anneal apparatus shown in FIG. 18 as a comparative example or a lamp type anneal apparatus 36 shown in FIG. 19 as a comparative example instead of the heat-conduction type anneal apparatus described above. However, it may be preferred not to use the batch type anneal apparatus 35 and the lamp type anneal apparatus 36 when the points shown below are considered to be important.

The batch type anneal apparatus 35 shown in FIG. 18 is a batch heat-conduction type anneal apparatus in which a rack 37 having a plurality of the semiconductor wafers 30 placed therein is inserted from below a plurality of fixed heaters 38 which generate heat by resistive heating into the space therebetween to heat the plural semiconductor wafers 30. However, since the batch type anneal apparatus 35 has a large-size anneal furnace, in a state where the fixed heaters 38 retain a high temperature, the rack 37 having the semiconductor wafers 30 placed therein cannot be introduced into or retrieved out of the batch type anneal apparatus 35. Therefore, after the rack 37 having the semiconductor wafers 30 placed therein is inserted between the fixed heaters 38, the temperature of the fixed heaters 38 is raised. Accordingly, it takes a long time to raise the temperature of the fixed heaters 38, and there is a long period of time during which the semiconductor wafers 30 are heated at a temperature lower than the target temperature and showing poor controllability before the semiconductor wafers 30 start to be heated at the desired temperature.

On the other hand, the lamp type anneal apparatus 36 shown in FIG. 19 has the problem that, in the same manner as in the batch type anneal apparatus 35 described above, it takes a long time to raise the temperature of the semiconductor wafer 30 to the desired temperature required for a heat treatment. This results from the fact that, in the lamp type anneal apparatus 36, the temperature of the semiconductor wafer 30 is measured with radiation thermometers 62 and, when the semiconductor wafer 30 is placed in the lamp type anneal apparatus, lamps (heaters) 60 cannot be held at a high temperature.

As shown in FIG. 19, the lamp type anneal apparatus 36 has a wafer stage 61 at the bottom portion of the apparatus, the plural lamps (tungsten halogen lamps) 60 for heating the semiconductor wafer 30 in the upper portion of the apparatus closer to the main surface of the semiconductor wafer 30, and the plural radiation thermometers 62 for measuring the temperature of the semiconductor wafer 30 below the wafer stage 61 and at the bottom portion of the apparatus. Note that, in the lamp type anneal apparatus 36, below the back surface of the semiconductor wafer 30, nothing is disposed which heats the semiconductor wafer 30. Examples of the lamp type anneal apparatus 36 include a halogen lamp and a flash lamp.

As shown in FIG. 19, in the lamp type anneal apparatus 36, the radiation thermometers 62 are used to measure the temperature of the semiconductor wafer 30. Normally, the temperature of the semiconductor wafer 30 is measured by sensing infrared light reflected by the surface of the semiconductor wafer 30. However, when the temperature of the semiconductor wafer 30 is not more than 250° C., the infrared light has a frequency transmitted by the semiconductor wafer 30. Therefore, the radiation thermometers 62 cannot sense the temperature of the semiconductor wafer 30 until the temperature of the semiconductor wafer 30 increases from a room-temperature state to about 260° C. Accordingly, in the lamp type anneal apparatus 36, the heat treatment is performed in such a manner as to temporarily hold the semiconductor wafer 30 at a constant temperature around 260° C. at which the temperature of the semiconductor wafer 30 can be measured. Specifically, it is required to perform soak annealing at about 260° C. over a period of 0.30 seconds to 60 seconds.

When the semiconductor wafer 30 is subjected to a heat treatment in the lamp type anneal apparatus 36, a phenomenon (overshoot) occurs in which, after the temperature of the semiconductor wafer 30 reaches 260° C. as the target temperature, it reaches a temperature higher than 260° C. This is because, in the lamp type anneal apparatus 36, the temperature of the semiconductor wafer 30 is measured with the radiation thermometers 62 and, when the temperature of the semiconductor wafer 30 reaches the target temperature, the heating using the lamps 60 is stopped to bring the temperature of the semiconductor wafer 30 closer to the target temperature. At this time, even when the heating using the lamps 60 is stopped when the temperature of the semiconductor wafer 30 reaches the target temperature, the temperature rise of the semiconductor wafer 30 does not immediately stop so that the overshoot occurs. As a result, in the lamp type anneal apparatus 36, the heat treatment of the semiconductor wafer 30 cannot be accurately performed.

As described above, in the lamp type anneal apparatus 36, the overshoot occurs during the heating of the semiconductor wafer 30. Accordingly, when the semiconductor wafer 30 is heated at a high temperature rise rate, a larger overshoot occurs and the heat treatment of the semiconductor wafer 30 cannot be accurately performed.

In the first heat treatment, the metal film 12 and the semiconductor substrate 1 react with each other at a temperature of not less than 200° C. to form the metal silicide layers 41. However, when the first heat treatment is performed using the lamp type anneal apparatus 36, the metal silicide layers 41 are formed also in a non-control region in which the temperature of the semiconductor wafer 30 is not less than 200° C., and it takes a long time for the semiconductor wafer 30 to subsequently reach the target temperature.

Thus, the lamp type anneal apparatus 36 cannot rapidly heat the semiconductor wafer 30 without causing an overshoot and needs a long heating time during the heat treatment, unlike the heat-conduction type anneal apparatus 20. As a result, a thermal budget (heat history) increases and the crystal grain diameter of NiSi in the metal silicide layers 41 formed in the first heat treatment increases. Specifically, when the first heat treatment is performed using the heat-conduction type anneal apparatus 20, in the metal silicide layers 41 formed by the first heat treatment, microcrystals of NiSi having an average crystal grain diameter of about 20 to 30 nm are formed. By contrast, when the first heat treatment is performed using the lamp type anneal apparatus 36, the crystal grain diameter of NiSi in the formed silicide layers increases to about several micrometers. In addition, when a heat treatment is performed using the lamp type anneal apparatus 36, crystals in the silicide layers tend to grow large, and therefore the problem arises that the silicide layers tend to abnormally grow in the channel of the semiconductor substrate 1.

Note that the abnormal growth of the metal silicide layers occurs when crystals of NiSi or microcrystals of $NiSi_2$ are formed in the metal silicide layers in the first heat treatment and when the semiconductor substrate reaches a high temperature of 300° C. to 600° C. in the second heat treatment, the step of forming contact plugs, the step of baking copper interconnects, or the like, which is subsequent to the first heat treatment.

By contact, in the heat-conduction type anneal apparatus 20 used in the first heat treatment of the present embodiment described using FIGS. 13 to 16, the temperature of the semiconductor wafer 30 is not adjusted by measuring the temperature of the semiconductor wafer 30 and increasing or reducing the temperature of the reactors 25 when the temperature of the semiconductor wafer 30 reaches the target temperature. Instead, the heating of the semiconductor wafer 30 is started in a state where the reactors 25 are heated in advance to the same temperature as the target temperature required for the heat treatment of the semiconductor wafer 30. Therefore, as described above, the temperature of the semiconductor wafer 30 does not rise to a level higher than that of the reactors 25 and the overshoot does not occur.

In the heat-conduction type anneal apparatus 20, the temperature of the semiconductor wafer 30 is not measured, and the temperature of the carbon heaters forming the reactors 25 is calculated from a value of a current allowed to flow in the carbon heaters or the like and set to maintain the target temperature of the heat treatment. Accordingly, it can be considered that, as described above, the semiconductor wafer 30 has the same temperature as the temperature of the reactors 25 of the heat-conduction type anneal apparatus 20. Therefore, in the first and second heat treatments using the heat-conduction type anneal apparatus 20 in the present embodiment, there is non-control region where the temperature of the semiconductor wafer 30 cannot be controlled.

By thus heating the semiconductor wafer 30 to the target temperature in a short time in the heat treatment and reducing the heating time other than that during the soak annealing, it is possible to reduce the thermal budget (heat history) and reduce the crystal grain diameter of NiSi in the formed metal silicide layers 41.

As has been described heretofore, when the abnormal growth of the metal silicide layers 41 is prevented and the low-resistance metal silicide layers 41 having film thicknesses of not more than 14 nm are formed, it is extremely advantageous to form microcrystals of NiSi in the metal silicide layers 41 using the heat-conduction type anneal apparatus 20 showing excellent temperature controllability in the first heat treatment and use the salicide process according to the partial reaction method.

Thus, in the present embodiment, the first heat treatment is performed using the heat-conduction type anneal apparatus 20 to form the metal silicide layers 41 formed of NiSi and Pt in the surfaces (upper-layer portions) of the gate electrode 8a and the source/drain regions (n$^+$-type semiconductor regions 9b) of the n-channel MISFET Qn and in the surfaces (upper-layer portions) of the gate electrode 8b and the source/drain regions (p$^+$-type semiconductor regions 10b) of the p-channel MISFET Qp. The film thicknesses of the metal silicide layers 41 depend on the thickness of the metal film 12 which reacts with the semiconductor substrate 1. When the thickness of the metal film 12 which reacts therewith is about 7 nm, the film thicknesses of the metal silicide layers 41 formed after the reaction are, e.g., about 14 nm.

Figure 20:
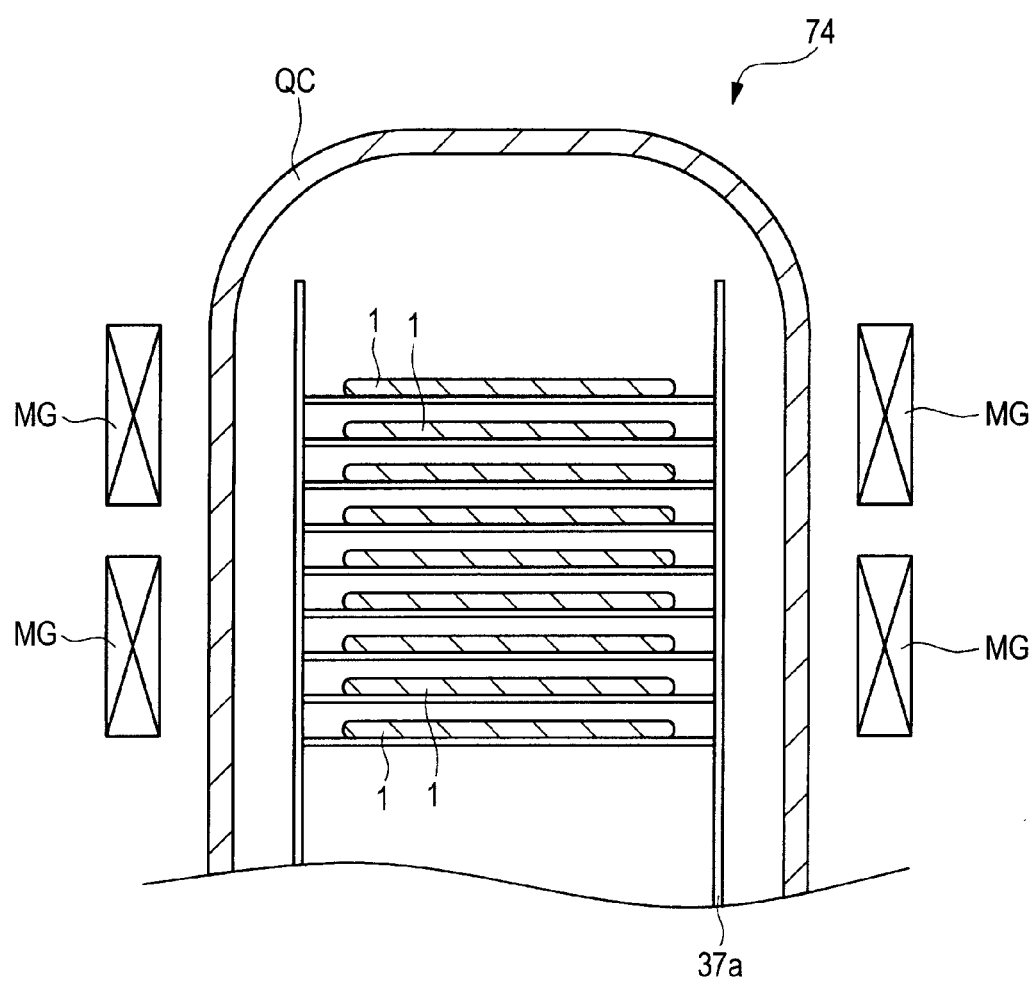
FIG. 20 is a cross-sectional view showing a microwave anneal apparatus.

Next, the batch type microwave anneal apparatus used in the second heat treatment of the present embodiment will be described using FIG. 20. FIG. 20 is a cross-sectional view of a batch type microwave anneal apparatus 74 used in the second heat treatment of the present embodiment.

As shown in FIG. 20, the microwave anneal apparatus 74 has a container (quartz chamber) QC containing quartz, magnetrons MG formed to surround the container QC, and a rack 37a for placing a plurality of the semiconductor substrates (wafers) 1 in the container QC. When the semiconductor substrates 1 are subjected to a heat treatment, the semiconductor substrates 1 placed in the rack 37a are irradiated with a microwave of 5.8 GHz generated using the magnetrons MG.

Since the 5.8 GHz microwave has a frequency absorbed by Si (silicon), the semiconductor substrates 1 irradiated with the microwave having the frequency absorb the microwave and the temperatures thereof rise so that the second heat treatment is performed at a temperature of about 200° C. to 300° C. Here, the heat treatment is performed at, e.g., 260° C.

Note that the reasons for setting the wavelength of the microwave used herein to 5.8 GHz is that Si is likely to absorb the microwave at the wavelength and that 5.8 GHz is a frequency band the use of which is permitted by a radio law. It can also be considered to use a microwave of 2.45 GHz to provide a frequency satisfying the two conditions but, in terms of meeting the standards of the radio law mentioned above and the standards of a semiconductor manufacturing apparatus, the use of a 5.8 GHz frequency is preferred.

Note that, in a short-time heat treatment of not longer than 30 seconds such as the first heat treatment, when the microwave anneal apparatus is used, it is more difficult to uniformly heat the semiconductor substrates having a pure metal formed over the entire surfaces thereof and accurately form each of the metal silicide layers to a uniform film thickness than when the heat-conduction type anneal apparatus is used. A pure metal reflects the microwave and is scarcely heated by the microwave so that, when the microwave anneal apparatus is used in a heat treatment, it is difficult to heat the semiconductor substrates covered with the pure metal. In the first heat treatment, the metal film 12 (see FIG. 11) which reflects the microwave is formed over the surface of each of the semiconductor substrates. Therefore, it is difficult to uniformly heat the semiconductor substrate using the microwave anneal apparatus in the first heat treatment.

By increasing the number of the magnetrons MG and densely arranging the magnetrons MG, the semiconductor substrates 1 can be more uniformly heat-treated. However, when the number of the magnetrons is increased, an amount of irradiation with the microwave increases to excessively raise the temperature of each of the semiconductor substrates 1 and increase the film thicknesses of the metal silicide layers. Therefore, to perform a heat treatment at a low temperature of about 200° C. to 300° C., it is necessary to reduce the number of the magnetrons to a certain value. Note that, by adjusting the positions of the rack 37a and the semiconductor substrates 1 in the container QC, it is possible to make an adjustment to irradiate the main surfaces of the semiconductor substrates 1 with the microwave as uniformly as possible and more uniformly heat the main surfaces of the semiconductor substrates 1. Moreover, as will be described later, even when the number of the magnetrons is small, the second heat treatment of the present embodiment can be performed for a longer time than the first heat treatment, and therefore the main surfaces of the semiconductor substrates 1 can be uniformly heated.

However, in the first heat treatment of the present embodiment which forms the metal silicide layers using the partial reaction method, as the heat treatment is performed for a longer time, a larger amount of the metal film reacts with each of the semiconductor substrates 1 to form the thick metal silicide layers so that it is difficult to uniformly heat the main surface of the semiconductor substrate 1 by a short-time heat treatment. When the main surface of the semiconductor substrate 1 cannot be uniformly heated, it may be possible that the diffusion of Ni cannot be controlled and Ni is locally diffused into a deeper region of the main surface of the semiconductor substrate 1 to cause the abnormal growth of the metal silicide layers. In addition, for the same reason, the controllability of the film thicknesses of the metal silicide layers deteriorates. For such reasons, when the microwave anneal apparatus is, used in the first heat treatment the temperature and time of which are limited, it is difficult to reduce the film thicknesses of the metal silicide layers without degrading the reliability of the semiconductor device.

By contrast, in the heat-conduction type anneal apparatus 20 described using FIGS. 13 to 16, the semiconductor substrate 1 is placed in the large-size heater and subjected to a heat treatment. Therefore, in the first heat treatment the temperature and time of which are limited, the semiconductor substrate 1 can be heated more uniformly than when the microwave anneal apparatus is used. In addition, it is possible to accurately form each of the metal silicide layers to a uniform film thickness and further prevent the abnormal growth of the metal silicide layers. That is, in the first heat treatment, the use of the heat-conduction type anneal apparatus, not the microwave anneal apparatus, allows easy uniform heating of the semiconductor substrate 1.

However, in the second heat treatment, the metal film 12 (see FIG. 11) has been removed and an amount of metal which reacts through the heat treatment has been predetermined. Therefore, by, e.g., elongating the time of irradiation with the microwave, the main surface of the semiconductor substrate 1 can be uniformly heated. The time of irradiation with the microwave is not less than 30 seconds and can be set to, e.g., 60 to 120 seconds. As a result, in a heat treatment step at a low heat treatment temperature of 200° C. to 300° C., even in a situation where the magnetrons MG shown in FIG. 20 cannot be increased, the use of the microwave anneal apparatus 74 in the second heat treatment presents no problem.

In the second heat treatment, by performing the heat treatment at a temperature of 200° C. to 300° C. using the microwave anneal apparatus 74, microcrystals of NiSi formed in the metal silicide layers 41 by the first heat treatment are grown and the metal silicide layers 41 are phase-transformed into the NiSi phase. Since NiSi is a phase more stable than $Ni_2Si$, the metal silicide layers 41 transformed into the NiSi phase by the second heat treatment have high heat resistance to result in layers each having a conductivity higher than that of $Ni_2Si$.

Figure 21:
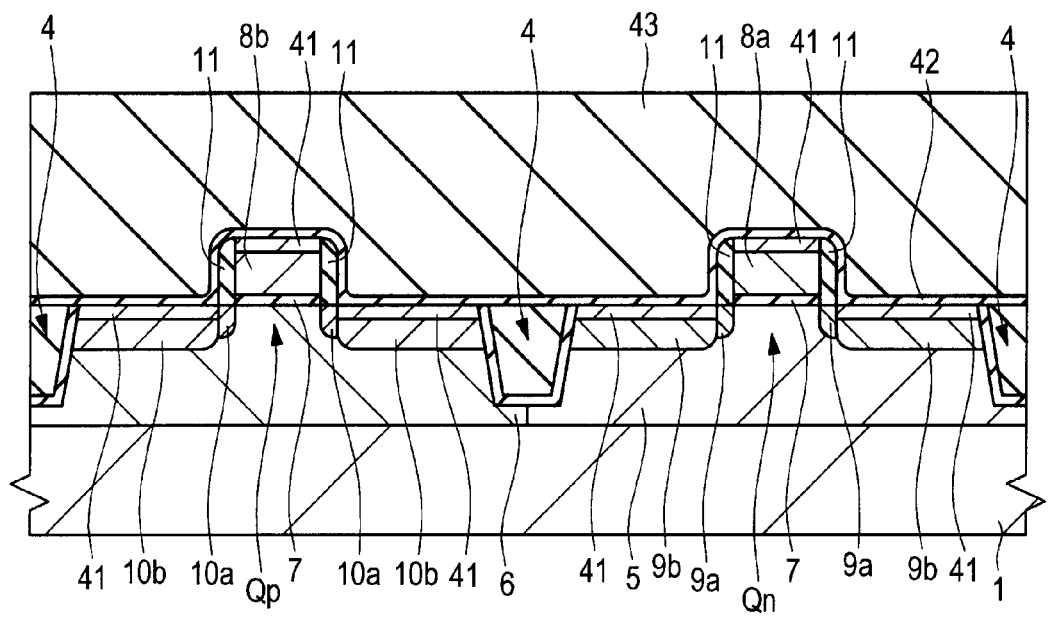
FIG. 21 is a main-portion cross-sectional view of the semiconductor device during a manufacturing step subsequent to that of FIG. 12.

Next, as shown in FIG. 21, over the main surface of the semiconductor substrate 1, the insulating film 42 is formed.

That is, the insulating film 42 is formed over the semiconductor substrate 1 including the metal silicide layers 41 so as to cover the gate electrodes 8a and 8b. The insulating film 42 is formed of, e.g., a silicon nitride film, and can be formed by a plasma CVD method at a film deposition temperature (substrate temperature) of about 450° C. or the like. Then, over the insulating film 42, the insulating film 43 thicker than the insulating film 42 is formed. The insulating film 43 is formed of, e.g., a silicon oxide film or the like, and can be formed by a plasma CVD method at a film deposition temperature of about 450° C. using TEOS or the like. In this manner, the interlayer insulating film including the insulating films 42 and 43 is formed. Thereafter, by polishing the surface of the insulating film 43 by a CMP method, and so forth, the upper surface of the insulating film 43 is planarized. Even when the surface of the insulating film 42 is formed in a rough shape resulting from an underlying level difference, by polishing the surface of the insulating film 43 by the CMP method, the interlayer insulating film having a planarized surface can be obtained.

Figure 22:
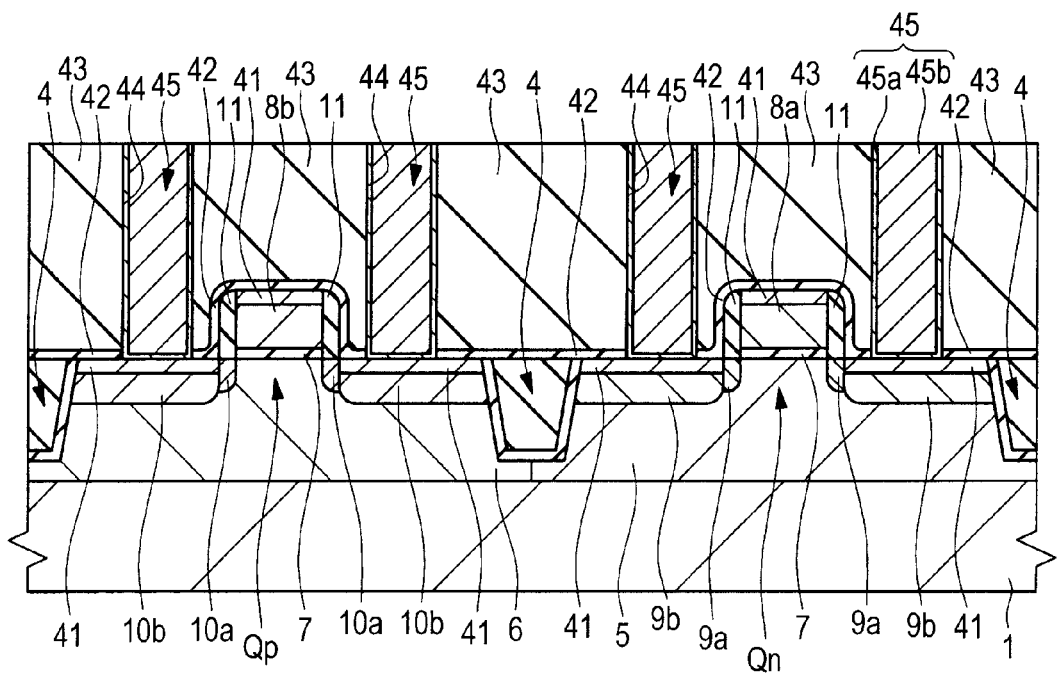
FIG. 22 is a main-portion cross-sectional view of the semiconductor device during a manufacturing step subsequent to that of FIG. 21.

Next, as shown in FIG. 22, using a photoresist pattern (not shown) formed over the insulating film 43 as an etching mask, the insulating films 43 and 42 are subjected to dry etching to be formed with contact holes (through holes or holes) 44. At this time, the dry etching of the insulating film 43 is performed first under conditions under which the insulating film 43 is more likely to be etched than the insulating film 42 to cause the insulating film 42 to function as an etching stopper film, and thereby form the contact holes 44 in the insulating film 43. Then, the insulating film 42 at the bottom portions of the contact holes 44 is subjected to dry etching under conditions under which the insulating film 42 is more likely to be etched than the insulating film 43, and thereby removed. At the bottom portions of the contact holes 44, parts of the main surface of the semiconductor substrate 1, e.g., parts of the metal silicide layers 41 over the respective surfaces of the $n^+$-type semiconductor regions 9b and the $p^+$-type semiconductor regions 10b and parts of the metal silicide layers 41 over the respective surfaces of the gate electrodes 8a and 8b are exposed.

Next, in the contact holes 44, the plugs (coupling conductor portions, buried plugs, or buried conductor portions) 45 formed of tungsten (W) or the like are formed. To form the plugs 45, for example, over the insulating film 43 including the insides (the bottom portions and the side walls) of the contact holes 44, a barrier conductor film 45a (e.g., titanium film, titanium nitride film, or a laminate film thereof) is formed by a plasma CVD method at a film deposition temperature (substrate temperature) of about 450° C. Then, a main conductor film 45b made of a tungsten film or the like is formed over the barrier conductor film 45a by a CVD method or the like so as to fill the contact holes 44. By removing the unneeded portions of the main conductor film 45b and the barrier conductor film 45a over the insulating film 43 by a CMP method, an etch-back method, or the like, the plugs 45 can be formed. The plugs 45 formed over the gate electrodes 8a and 8b, the $n^+$-type semiconductor regions 9b, and the $p^+$-type semiconductor regions 10b have bottom portions thereof in contact with the metal silicide layers 41 over the respective surfaces of the gate electrodes 8a and 8b, the $n^+$-type semiconductor regions 9b, and the $p^+$-type semiconductor regions 10b to be electrically coupled.

Figure 23:
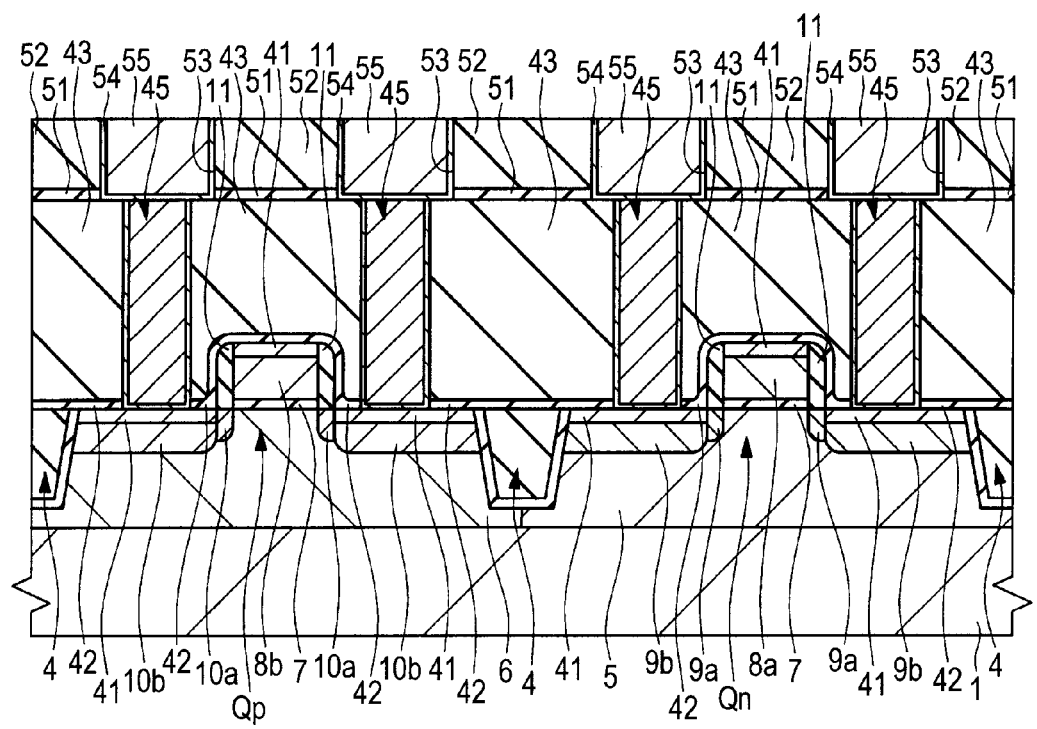
FIG. 23 is a main-portion cross-sectional view of the semiconductor device during a manufacturing step subsequent to that of FIG. 22.

Next, as shown in FIG. 23, over the insulating film 43 in which the plugs 45 are buried, the stopper insulating film 51 and the insulating film 52 for forming the interconnects are successively formed. The stopper insulating film 51 serves as an etching stopper during the trenching of the insulating film 52, and uses a material having an etching selectivity to the insulating film 52. The stopper insulating film 51 can be formed of, e.g., a silicon nitride film formed by a plasma CVD method, while the insulating film 52 can be formed of, e.g., a silicon oxide film formed by a plasma CVD method. Note that, in the stopper insulating film 51 and the insulating film 52, first-layer interconnects described next are formed.

Next, the first-layer interconnects are formed by a single damascene method. First, by dry etching using a resist pattern (not shown) as a mask, the interconnect trenches 53 are formed in the predetermined regions of the insulating film 52 and the stopper insulating film 51. Then, over the main surface (i.e., over the insulating film 52 including the bottom portions and side walls of the interconnect trenches) of the semiconductor substrate 1, the barrier conductor film (barrier metal film) 54 is formed. Examples of the barrier conductor film 54 that can be used include titanium nitride film, tantalum film, and tantalum nitride film. Subsequently, by a CVD method, a sputtering method, or the like, a copper seed layer is formed over the barrier conductor film 54. Further, using an electrolytic plating method or the like, a copper plating film is formed over the seed layer. With the copper plating film, the insides of the interconnect trenches 53 are filled. Then, the copper plating film, the seed layer, and the barrier conductor film 54 in the regions other than the interconnect trenches 53 are removed therefrom by a CMP method so that the first-layer interconnects 55 containing copper as a main conductive material are formed. The interconnects 55 are electrically coupled to the $n^+$-type semiconductor regions 9b and the $p^+$-type semiconductor regions 10b for the sources or drains of the n-channel MISFETs Qn and the p-channel MISFETs Qp, the gate electrodes 8a and 8b thereof, and the like via the plugs 45. Thereafter, second-layer interconnects are formed by a dual damascene method, but the depiction and description thereof is omitted here. By the foregoing process, the semiconductor device of the present embodiment is completed.

Next, the effects of the present embodiment will be described in greater detail. First, a description will be given of the use of the microwave anneal apparatus in the second heat treatment.

Figure 24:
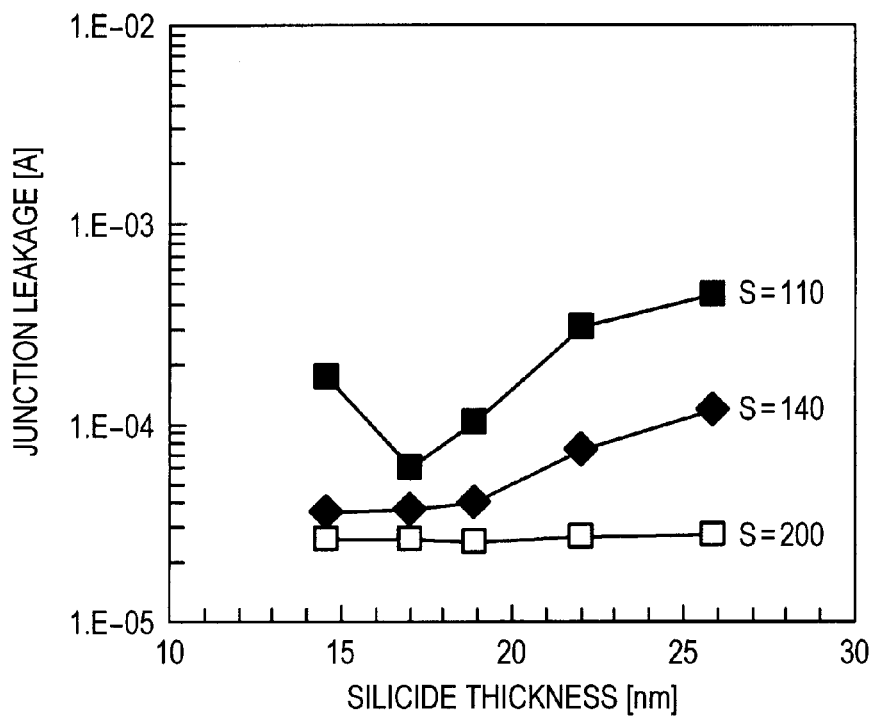
FIG. 24 is graphs each showing a relationship between the film thickness of a metal silicide layer and a junction leakage current.

In a semiconductor device in which adjacent MISFETs share a drain region, with the recent scaling down of semiconductor devices, the distance between the MISFETs, i.e., a distance S between the respective gate electrodes of the MISFETs is reduced. In this case, as shown in the graphs of FIG. 24, a junction leakage current between the gates tends to increase as the foregoing distance S decreases. Note that the abscissa axis of the graphs of FIG. 24 represents the film thickness of a metal silicide layer and the ordinate axis thereof represents a junction leakage current in the metal silicide layer. FIG. 24 shows the graphs for respective cases where the distance S is 110 nm, 140 nm, and 200 nm.

Here, it can be seen that, when the film thickness of the metal silicide layer is reduced to a value of not more than 15 nm with the scaling down of semiconductor devices, the junction leakage current has rapidly increased compared with that when the film thickness of the metal silicide layer is about 17 nm. This has occurred because, due to the reduced film thickness of the metal silicide layer, it has become difficult to form the metal silicide layer of stable film thickness and the metal silicide layer formed of NiSi or $NiSi_2$ abnormally grows, e.g., in the depth direction of the semiconductor substrate or toward a channel region immediately below the gate electrode.

It can be seen that, conversely, when the film thickness of the metal silicide layer has increased also, the junction leakage current has increased, as shown in FIG. 24. The reason for this is that, since the increased film thickness of the metal silicide layer has brought the metal silicide layer closer to the interface between each of source/drain regions and a well, a leakage current is likely to flow between the metal silicide layer and the semiconductor substrate.

Figure 25:
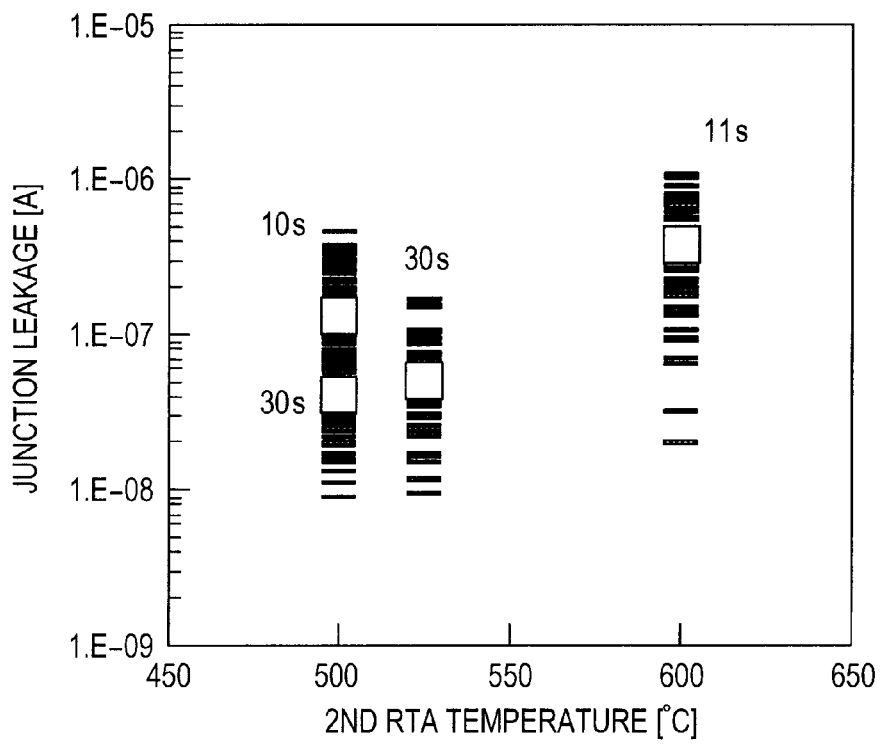
FIG. 25 is graphs each showing a relationship between the temperature of a second heat treatment and the junction leakage current.

The present inventors have found that, when the heat-conduction type anneal apparatus is used in each of the first and second heat treatments, if the film thickness of the metal silicide layer is reduced to a value of not more than 15 nm, the film thickness of the metal silicide layer becomes unstable and abnormal growth of the metal silicide layer is likely to occur. One reason for this can be that, in the second heat treatment performed using the heat-conduction type anneal apparatus, it is required to increase the temperature of the heat treatment to a high level of not less than 400° C., e.g., about 500° C. to 600° C. FIG. 25 is graphs each showing, in a PN diode having a metal silicide layer formed over a semiconductor substrate by first and second heat treatments each using a heat-conduction type anneal apparatus and a semiconductor layer having a second conductivity type and formed under the metal silicide layer via a semiconductor layer having a first conductivity type, a junction leakage current (ordinate axis) between the metal silicide layer and the semiconductor layer having the second conductivity type against the temperature (abscissa axis) of the second heat treatment (2nd RTA). FIG. 25 shows a plurality of measurement results obtained by varying the time during which the heat treatment is performed. It can been seen that, when the second heat treatment is performed at a high temperature of about 500° C. to 600° C., each of the values of the junction leakage currents increases, the metal silicide layer tends to deteriorate, and accordingly a process margin is small.

Figure 26:
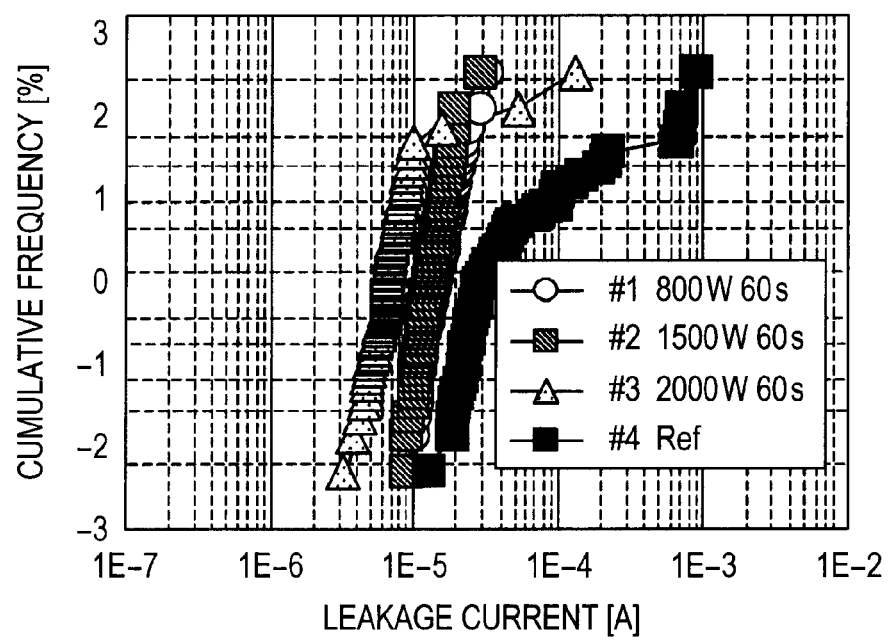
FIG. 26 is graphs each showing a cumulative frequency distribution of the junction leakage current in the semiconductor device.

To avoid thus performing the second heat treatment at a high temperature, in the second heat treatment of the present embodiment, the microwave anneal apparatus described above is used. As shown in the graphs of FIG. 26, the power (output) of the microwave anneal apparatus is excellent in each of the ranges of not less than 800 W and nor more than 2000 W and, by performing the heat treatment particularly with the power of 1500 W, the leakage current can be stably reduced. Note that the abscissa axis of the graphs of FIG. 26 shows the leakage current and the ordinate axis shows a cumulative frequency distribution.

Figure 27:
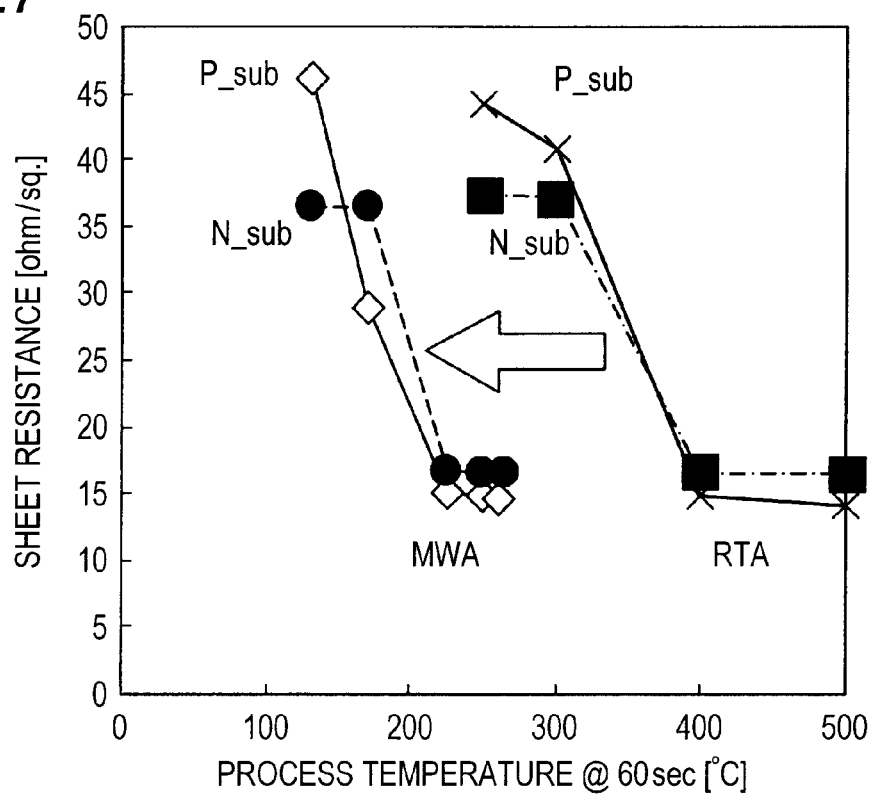
FIG. 27 is graphs each showing a temperature at which the metal silicide layer is phase transformed.

Each of the graphs shown in FIG. 27 shows a temperature (abscissa axis) at which the metal silicide layer is phase-transformed from a $Ni_2Si$ phase in which a sheet resistance (ordinate axis) is high into the NiSi phase in which the sheet resistance is low. FIG. 27 shows respective cases where the metal silicide layer is formed over an n-type substrate (N_sub) and where the metal silicide layer is formed over a p-type substrate (P_sub) when the heat-conduction type anneal apparatus is used in the second heat treatment ("RTA" of FIG. 27) and when the microwave anneal apparatus is used in the second heat treatment ("MWA" of FIG. 27). That is, FIG. 27 shows formation curves when the metal silicide layer is phase-transformed from the metal-rich phase to the silicon-rich phase.

As shown in FIG. 27, when the heat-conduction type anneal apparatus is used in the second heat treatment, the phase transformation has occurred at about 400° C. while, when the microwave anneal apparatus is used in the second heat treatment as in the present embodiment, the phase transformation has occurred at about 200° C. That is, for the reason described above, it is necessary to perform the second heat treatment in the heat-conduction type anneal apparatus using a high temperature of not less than 400° C., e.g., 500° C. to 600° C. but, in the microwave anneal apparatus, the second heat treatment can be performed at a low temperature of about 200 to 300° C.

When the heat-conduction type anneal apparatus is used, it is possible to phase-transform the metal silicide layer into the NiSi phase even at 400° C., but it is actually necessary to perform the heat treatment at a higher temperature of about 500° C. to 600° C. This is because, in the heat treatment at 400° C., solid crystals of NiSi are unlikely to be formed in the metal silicide layer and, at a temperature of about 500° C. reached in the step of forming the contact plugs or the copper interconnects subsequent to the second heat treatment, NiSi in the metal silicide layer moves to probably degrade the metal silicide layer. Note that, when the second heat treatment is performed at a high temperature over 600° C., the metal silicide layer is damaged to have degraded heat resistance.

Figure 35:
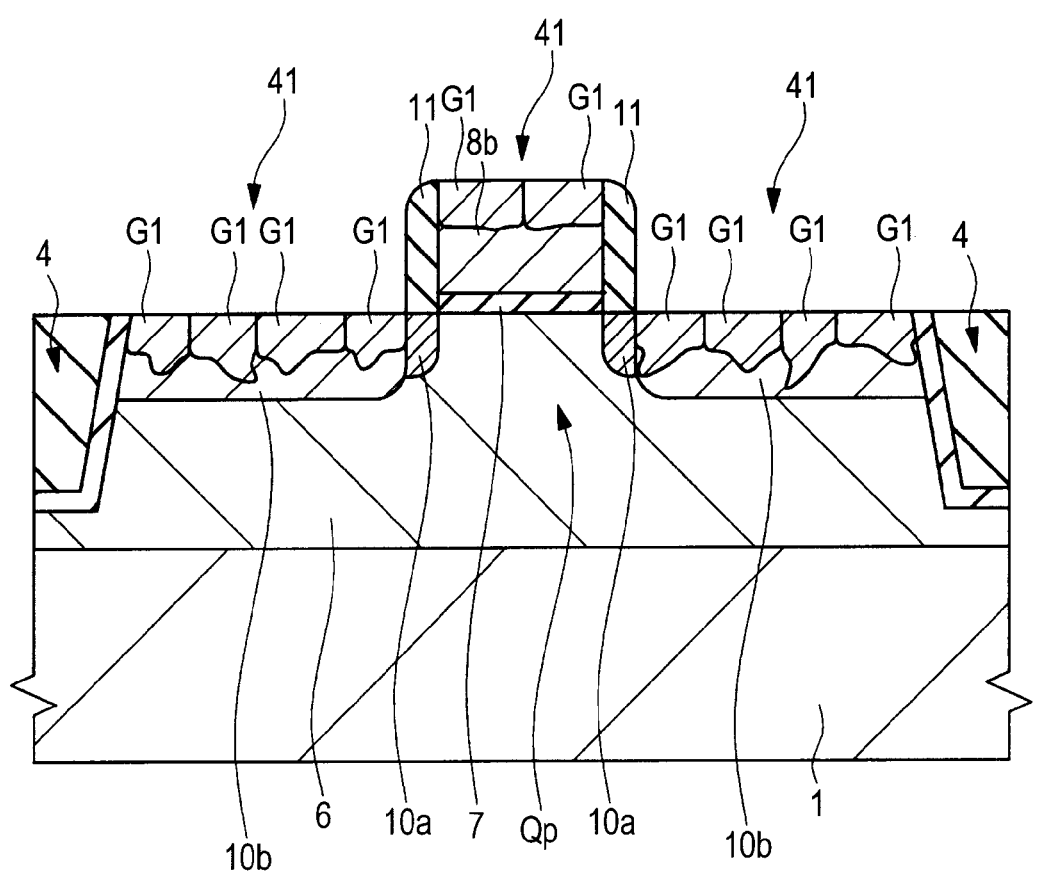
FIG. 35 is a main-portion cross-sectional view showing a semiconductor device as the comparative example.

FIG. 35 shows, as a comparative example, a main-portion cross-sectional view of a semiconductor device containing the metal silicide layers 41 that have been phase-transformed by performing the second heat treatment at a high temperature of 500° C. to 600° C. using the heat-conduction type anneal apparatus. Note that the metal silicide layer 41 shown in FIG. 35 is formed of a plurality of crystals (grains) G1 formed of NiSi. As shown in FIG. 35, as a result of performing the second heat treatment at a high temperature, the crystals of NiSi that have abnormally grown are formed to extend in the depth direction toward the lower surface of the semiconductor substrate 1 or the like. In such a case, between the metal silicide layer 41 and the semiconductor substrate 1, a leakage current is likely to occur and the reliability of the semiconductor device extremely deteriorates.

The reason that the second heat treatment can be performed at a low temperature when the microwave anneal apparatus is used as described above is because, while it is impossible to selectively heat Si forming the semiconductor substrate by a method which heats the semiconductor substrate by radiating heat, it is possible to selectively heat Si forming the semiconductor substrate in the microwave anneal apparatus. Since the 5.8 GHz microwave used herein is a microwave at a wavelength absorbed by Si, it is possible to directly heat, not a metal silicide layer containing NiSi, $Ni_2Si$, or the like and an insulating of $SiO_2$ or the like, but only the semiconductor substrate mainly containing Si. Here, Ni as a metal reflects the microwave and is therefore not directly heated by the microwave. That is, the difference between the heat-conduction type anneal apparatus and the microwave anneal apparatus is that, while the heat-conduction type anneal apparatus achieves silicidation by heating Ni having high conductivity, i.e., a metal, the microwave anneal apparatus achieves silicidation by directly heating the silicon substrate.

Since Ni has a relatively high diffusion coefficient and is considerably diffused at a temperature of not less than 400° C., in the second heat treatment using the heat-conduction type anneal apparatus which requires a heat treatment performed at a high temperature, it is difficult to accurately reduce the film thickness of the metal silicide layer and prevent the abnormal growth of the metal silicide layer resulting from abnormal diffusion. By contrast, by reducing the temperature of the second heat treatment as described above, it is possible to prevent the abnormal diffusion of Ni in the second heat treatment, prevent the abnormal growth of the metal silicide layer having a film thickness of not more than 15 nm, and reduce an increase in the junction leakage current between the semiconductor substrate and the metal silicide layer.

In each of the metal silicide layers 41 shown in FIG. 12, Pt (platinum) is segregated in the vicinity of, the upper surface of the metal silicide layer 41 after the first heat treatment and prior to the second heat treatment. However, by performing the second heat treatment using the microwave anneal apparatus, it is possible to cause a large amount of Pt (platinum) to be segregated at the inner bottom surface of the metal silicide layer 41, which is the interface between the semiconductor substrate 1 and the metal silicide layer 41. The layer of Pt segregated in the vicinity of the interface between the semiconductor substrate 1 and the metal silicide layer 41 serves as a barrier film which prevents Ni in the metal silicide layer 41 from jumping toward the semiconductor substrate 1 and being diffused.

When the second heat treatment is performed using the heat-conduction type anneal apparatus or the lamp type anneal apparatus, the surface of the semiconductor substrate 1 is not uniformly heated and fluctuations, such as a local increase in surface temperature, frequently occur. When a portion where the temperature is locally high is thus formed, Ni has a higher diffusion coefficient and tends to be diffused from the surface of the semiconductor substrate 1 into a deeper region. When the surface of the semiconductor substrate 1 thus locally has a temperature higher than a desired temperature, Ni is diffused into regions deeper than regions where the metal silicide layers are desired to be formed to form NiSi crystals or $NiSi_2$ crystals. The NiSi crystals or $NiSi_2$ crystals serve to cause the abnormal growth of the metal silicide layers 41.

In the second heat treatment, if Ni is locally diffused into the deeper regions due to heat fluctuations, roughness occurs at the bottom surface of each of the formed metal silicide layers 41, which is the interface with the semiconductor substrate 1. As a result, the distance between the metal silicide layer 41 and the n-type well 6 or the p-type well 5, i.e., the thicknesses of the $n^+$-type semiconductor regions $9b$ and the $p^+$-type semiconductor regions $10b$ cannot be held constant. In this case, it may be possible that the characteristic of the junction leakage current between the metal silicide layer 41 and the semiconductor substrate 1 is not determined in some locations and the reliability of the semiconductor device may deteriorate. In addition, if Ni is locally diffused into deeper regions to form NiSi or $NiSi_2$, a reduction in the film thickness of the metal silicide layer 41 is inhibited thereby.

By contrast, in the present embodiment, Pt (platinum) is diffused to be segregated in a larger amount at the bottom surfaces of the metal silicide layers 41, as described above. As a result, the layer of Pt can prevent Ni from being diffused into deeper regions.

In the second heat treatment using the heat-conduction type anneal apparatus, Pt remains segregated in upper layers in the metal silicide layers 41 and is scarcely diffused to the inner bottom portions of the metal silicide layers 41. This is because, in the second heat treatment using the heat-conduction type anneal apparatus, the semiconductor substrate 1 reaches a high temperature of about 500° C. and the diffusion coefficient of Ni greatly surpasses the diffusion coefficient of Pt to inhibit the diffusion of Pt. Pt has a diffusion coefficient higher than that of Ni at a low temperature of about 200° C. to 300° C., and the diffusion coefficient thereof increases as the temperature rises. However, at a high temperature of about 500° C., Ni has a diffusion coefficient higher than that of Pt, and therefore Pt cannot be diffused. In addition, as the temperature of the heat treatment rises, a heat load in each of the metal silicide layers 41 may increase to degrade the metal silicide layer 41 and, as described above, the abnormal diffusion of Ni becomes remarkable. Moreover, in the second heat treatment using the heat-conduction type anneal apparatus, to prevent a heat load from being given to the metal silicide layer 41, the heat treatment needs to be performed within a period of less than 30 seconds. Therefore, it is not possible to provide a sufficient time for Pt to be diffused.

By contrast, if the microwave anneal apparatus is used in the second heat treatment as in the present embodiment, the temperature of the heat treatment can be reduced to allow the heat treatment to be performed in a state where Pt has a higher diffusion coefficient than Ni and allow a large amount of Pt to be segregated at the inner bottom surface of the metal silicide layer 41. In addition, since the heat treatment temperature is low, the heat temperature can be performed over a period of not less than 30 seconds (e.g., about 60 to 120 seconds). This allows a large amount of Pt to be segregated at the inner bottom surface of the metal silicide layer 41, despite the relatively low diffusion coefficient of Pt. By thus causing a large amount of Pt to be segregated at the interface between the metal silicide layer 41 and the surface of the semiconductor substrate 1, it is possible to cause the Pt layer to function as the barrier film and prevent the abnormal diffusion of Ni, as described above.

Figure 28:
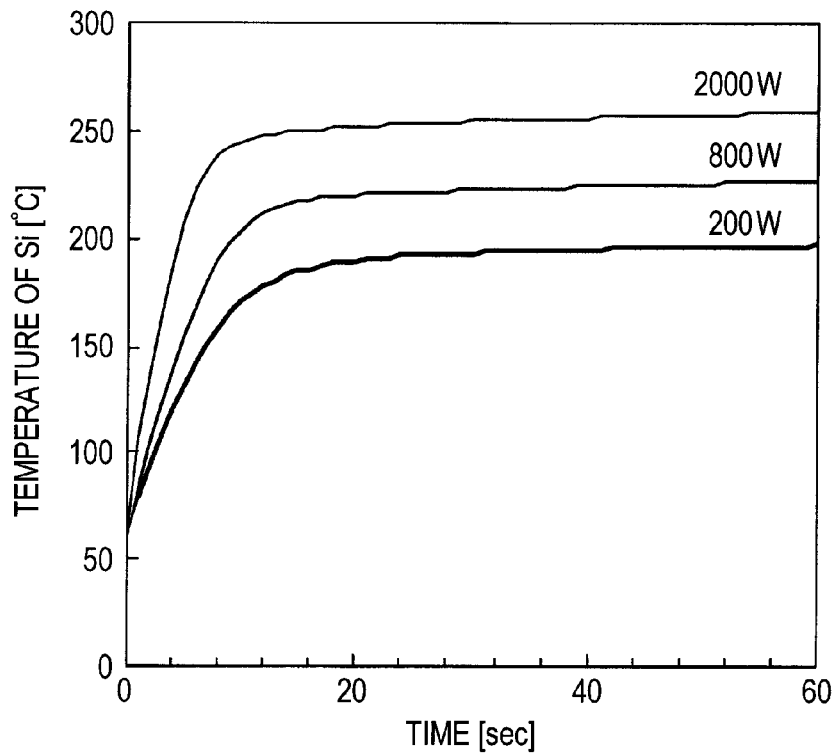
FIG. 28 is graphs each showing the time of heating using the microwave anneal apparatus and the temperature of a semiconductor substrate.

Note that the reason for setting the heating time of the second heat treatment using the microwave anneal apparatus to 30 seconds or more is because, as shown in FIG. 28, 30 seconds are required by the temperature of the semiconductor substrate to be stabilized. FIG. 28 is graphs each showing the temperature (ordinate axis) of the semiconductor substrate against the heating time (abscissa axis) in the second heat treatment using the microwave anneal apparatus and shows the graphs for respective cases where the power of the microwave is set to 200 W, 800 W, and 2000 W. As can be seen from FIG. 28, the temperature of the semiconductor substrate has not been momentarily stabilized after heating is started, but needs a time of 30 seconds to be stabilized. Note that the temperature of the semiconductor substrate measured in FIG. 28 is specifically the temperature of the bottom surface of the semiconductor substrate. However, since the semiconductor substrate containing Si is uniformly heated in a microwave anneal treatment, it is assumed that the temperature of the semiconductor substrate at the interface between the metal silicide layer and the semiconductor substrate also has the same temperature as the temperature of the back surface of the semiconductor substrate.

Also, the reason that a large amount of Pt can be segregated at the inner bottom surface of each of the metal silicide layers 41 is because the second heat treatment can be performed at a low temperature at a level at which the diffusion coefficient of Ni does not increase. The reason that the heat treatment can thus be performed at a low temperature can be because, in the manufacturing steps of the semiconductor device of the present embodiment using the microwave anneal apparatus, by directly heating the semiconductor substrate 1, the metal silicide layers 41 containing a metal are indirectly heated and, compared with the case where the heat-conduction type anneal apparatus which mainly heats the metal is used, the second heat treatment can be performed in a state where the metal silicide layers 41 have lower temperatures.

Figure 29:
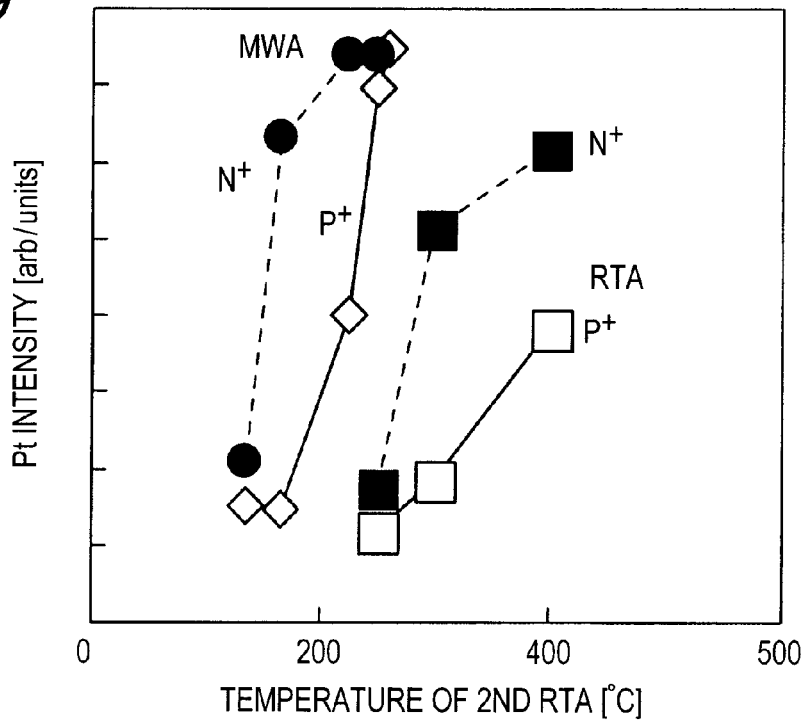
FIG. 29 is graphs each showing a relationship between the temperature of a second heat treatment and the degree of segregation of Pt.

FIG. 29 is graphs each showing the degree of segregation (ordinate axis) of Pt (platinum) against the temperature of the second heat treatment (abscissa axis) and shows the graphs for the metal silicide layers over the n-type diffusion layers and the p-type diffusion layers in respective cases where a heat-conduction type anneal treatment (RTA) has been performed and where a microwave anneal treatment (MWA) has been performed. From FIG. 29, it can be seen that, as the temperature increases, the degree of segregation of Pt increases. It can also been seen that, when the temperature has increased to a certain level, the degree of segregation of Pt does not increase so remarkably in the metal silicide layers over the n-type diffusion layers while, even at a temperature higher than the temperature, the degree of segregation of Pt further increases in the metal silicide layers over the p-type diffusion layers.

As described above using FIG. 2, in the n-channel MISFET having the n-type diffusion layers, it is preferable to prevent Pt from being segregated at the bottom portions of the metal silicide layers while, in the p-channel MISFET having the p-type diffusion layers, it is preferable to cause a large amount of Pt to be segregated at the bottom portions of the metal silicide layers. Therefore, as can be seen from FIG. 29, if the temperature of the heat treatment is increased, a desired distribution of Pt can be obtained. FIG. 29 shows that, when the microwave anneal apparatus is used, such segregation (diffusion) of Pt can be achieved at a lower temperature than when the heat-conduction type anneal apparatus is used.

The following is the reason that, as shown in FIGS. 2(c) and 2(d), the degrees of segregation of Pt are different in the p-channel MISFET and the n-channel MISFET. That is, in the p-channel MISFET Qp and the n-channel MISFET Qn which are shown in FIG. 12, due to the different impurities (dopants), the diameters of crystal grains (crystals) are different in the p$^+$-type semiconductor regions 10b and the n$^+$-type semiconductor regions 9b. The crystal grain diameters mentioned herein indicate the diameters of crystals in a direction along the main surface of the semiconductor substrate 1. In the n$^+$-type semiconductor regions 9b where the crystal grain diameters are small, it is difficult for Pt to linearly move between crystals so that Pt is unlikely to be diffused. In the p$^+$-type semiconductor regions 10b where the crystal grain diameters are large, Pt is easy to linearly move between crystals so that Pt in the metal silicide layers 41 is more likely to be diffused in the p-channel MISFET Qp than in the n-channel MISFET Qn.

As described above, by performing the second heat treatment at a low temperature and promoting the segregation of Pt, abnormal growth of the metal silicide layers 41 can be prevented. As a result, it is possible to reduce the junction leakage current in the CMISFET and improve the reliability of the semiconductor device. In addition, by preventing excessive diffusion of Ni, a reduction in the film thickness of each of the metal silicide layers 41 can be facilitated. Furthermore, since it is possible to prevent roughness at the interface between the metal silicide layer 41 and the semiconductor substrate 1 and planarize the foregoing interface, it is possible to hold the performance of the CMISFET constant and improve the reliability of the semiconductor device.

Next, a description will be given of the use of the heat-conduction type anneal apparatus, not the microwave anneal apparatus, in the first heat treatment.

The manufacturing steps of the semiconductor device of the present embodiment is characterized in that, in the second heat treatment for forming the metal silicide layers, the microwave anneal apparatus is used to reduce the temperature of the heat treatment. However, in the first heat treatment performed at substantially the same temperature as that of the second heat treatment, not the microwave anneal apparatus, but the heat-conduction type anneal apparatus is used. This is because, as described using FIG. 20, it is difficult to uniformly heat the semiconductor substrate having a pure metal attached to the entire surface thereof using the microwave anneal apparatus in the first heat treatment and the diffusion of Ni cannot be controlled so that the film thicknesses of the metal silicide layers are non-uniform.

The reason that the microwave anneal apparatus is not used in the first heat treatment is not only because, with the microwave anneal apparatus, the semiconductor substrate having a pure metal attached to the entire surface thereof cannot be uniformly heated, but also because, by mainly heating the metal film 12 shown in FIG. 11 using the heat-conduction type anneal apparatus, it is easier to form the metal-rich phase mainly containing Ni$_2$Si at the interface with the semiconductor substrate 1 having a temperature lower than that of the metal film 12 and form microcrystals of NiSi therein.

When the microwave anneal apparatus is used in the first heat treatment, the metal film 12 reflects a microwave so that the semiconductor substrate containing Si has a temperature higher than that of the metal film 12. As a result, at the interfaces between the semiconductor substrate 1 and the metal silicide layers 41, the diffusion of Ni and the formation of crystals are more likely to proceed and crystals of NiSi having crystal grain diameters larger than those of microcrystals of NiSi are more likely to be formed at the lower surfaces of the metal silicide layers 41 in the metal-rich phase containing Ni$_2$Si.

When crystals of NiSi having crystal grain diameters larger than those of microcrystals or microcrystals of NiSi$_2$ are formed in the first heat treatment, NiSi or NiSi$_2$ is likely to abnormally grow due to a high temperature in the second heat treatment, the step of forming the contact plugs, or the step of forming the copper interconnects, which is subsequently performed, and the problem of an increased junction leakage current in the metal silicide layers 41 occurs. Note that the abnormal growth of the metal silicide layers 41 is unlikely to occur in the first heat treatment, but is likely to occur when the second heat treatment is performed at a temperature of about 500° C. to 600° C. using the heat-conduction type anneal apparatus. Also, when the contact plugs containing W (tungsten) are formed over the metal silicide layers 41 at a high temperature of about 500° C. or when a heat treatment for baking the copper interconnects formed over the contact holes is performed at a temperature of about 300° C., abnormal growth of the metal silicide layers 41 is likely to occur.

Therefore, when the first heat treatment is performed using the microwave anneal apparatus, crystals of NiSi or microcrystals of NiSi$_2$ are likely to be formed. As a result, even when the second heat treatment is performed using the microwave anneal apparatus, the abnormal growth of the metal silicide layers 41 cannot be effectively prevented, the interfaces between the metal silicide layers 41 and the semiconductor substrate 1 become non-uniform, and the film thicknesses of the metal silicide layers 41 are difficult to be controlled. That is, if the microwave anneal apparatus is used in each of the first and second heat treatments, the effect resulting from the use of the microwave anneal apparatus in the second heat treatment cannot be obtained.

By contrast, when the first heat treatment is performed using the heat-conduction type anneal apparatus as in the present embodiment, the metal silicide layers 41 and the metal film 12 each containing a metal (Ni) have temperatures higher than that of the semiconductor substrate 1. In this case, since the semiconductor substrate 1 has a relatively low temperature, crystals of NiSi are unlikely to be formed at the interfaces between the metal silicide layers 41 and the semiconductor substrate 1 and microcrystals of NiSi can be formed in the metal silicide layers 41 each formed of the metal-rich phase mainly containing Ni$_2$Si. As a result, it is possible to suppress the diffusion of Ni and control the formation of NiSi, and therefore it is possible to prevent the abnormal growth of NiSi in the subsequent heat treatment.

In the present embodiment, in the second heat treatment, the microwave anneal apparatus is used in order to reduce the temperature thereof. However, in the first heat treatment, the temperature thereof is 250° C. to 300° C. and originally sufficiently low so that there is no need to use the microwave anneal apparatus.

For the reason described above, the first heat treatment uses the heat-conduction type anneal apparatus, not the microwave anneal apparatus, to thereby prevent the abnormal growth of the metal silicide layers 41 and non-uniformity in the film thickness of each of the metal silicide layers 41. This suppresses an increase in the junction leakage current in the metal silicide layers 41 and allows an improvement in the reliability of the semiconductor device.

Note that, when the heat treatment is performed using the heat-conduction type anneal apparatus or the lamp type anneal apparatus, in a region where a large number of insulating films such as STI are formed in the main surface of the semiconductor substrate, the insulating films are likely to absorb heat so that elements formed in the vicinity of the insulating films have relatively high temperatures. By contrast, a region where not a large number of insulating films are formed and elements such as, e.g., MISFETs are densely provided has a characteristic feature of a relatively low temperature due to a smaller number of insulating films which are likely to absorb heat. That is, a problem arises that, due to the arrangement (layout) pattern of the elements and the isolation regions, the temperature at which the main surface of the semiconductor substrate is heated becomes non-uniform. Such a characteristic feature is particularly noticeable in a radiation type heating apparatus such as the lamp type anneal apparatus 36 described using FIG. 19, and a heat absorption difference is likely to be produced between Si and $SiO_2$ or the like.

By contrast, in the present embodiment, the second heat treatment uses the microwave anneal apparatus to directly heat Si in the semiconductor substrate. Accordingly, regardless of layout, it is possible to uniformly heat the semiconductor substrate.

Figure 30:
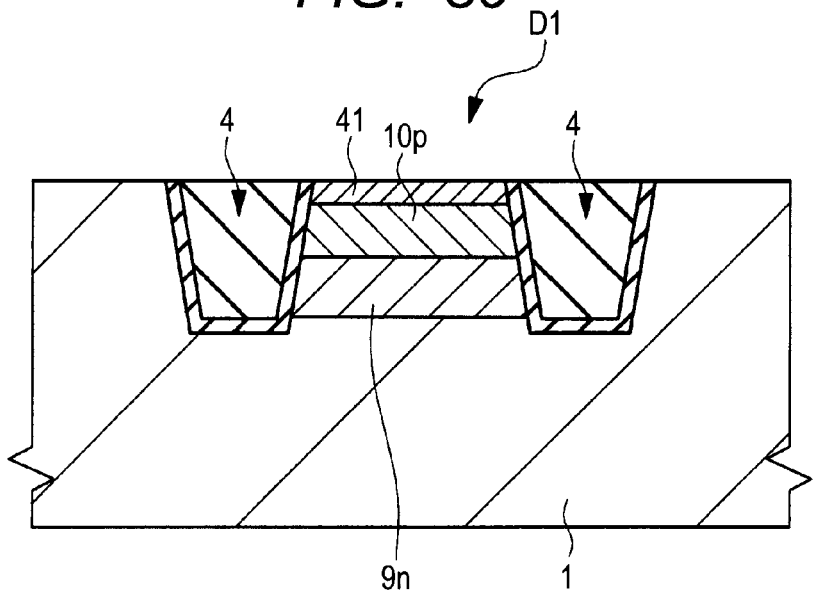
FIG. 30 is a main-portion cross-sectional view of a semiconductor device shown as a variation of the present embodiment.

In the present embodiment, by enabling the second heat treatment to be performed at a low temperature, the junction leakage current in the metal silicide layers is reduced. Such an effect is particularly noticeable in a p-channel MISFET, not in an n-channel MISFET. Also, in the present embodiment, the silicide layers of the CMISFET have been described, but the present invention is not limited thereto. For example, in the PN junction diode D1 shown in FIG. 30 also, the junction leakage current in the metal silicide layers 41 can similarly be reduced. FIG. 30 is a main-portion cross-sectional view showing the diode D1 as a variation of the present embodiment.

As shown in FIG. 30, the plural isolation regions 4 are formed in the main surface of the semiconductor substrate 1. In the main surface of the semiconductor substrate 1 between the isolation regions 4, a p-type semiconductor region 10p into which a p-type impurity (e.g., B (boron)) has been introduced is formed. In the bottom portion of the p-type semiconductor region 10p, an n-type semiconductor region 9n into which an n-type impurity (e.g., P (phosphorus)) has been introduced is formed. Over the p-type semiconductor region 10p, the metal silicide layer 41 is formed. The p-type semiconductor region 10p and the n-type semiconductor region 9n form the diode D1.

In the diode D1 shown in FIG. 30 also, when the heat-conduction type anneal apparatus or the lamp type anneal apparatus is used in the second heat treatment for forming the metal silicide layer 41, the metal silicide layer 41 abnormally grows, the film thickness thereof becomes non-uniform, and so forth. This results in the problem that a leakage current is likely to flow between the metal silicide layer 41 and the n-type semiconductor region 9n. By contrast, by using the heat-conduction type anneal apparatus, not the microwave anneal apparatus, in the first heat treatment and using the microwave anneal apparatus in the second heat treatment as in the present embodiment, it is possible to reduce the junction leakage current in the metal silicide layer 41.

Figure 31:
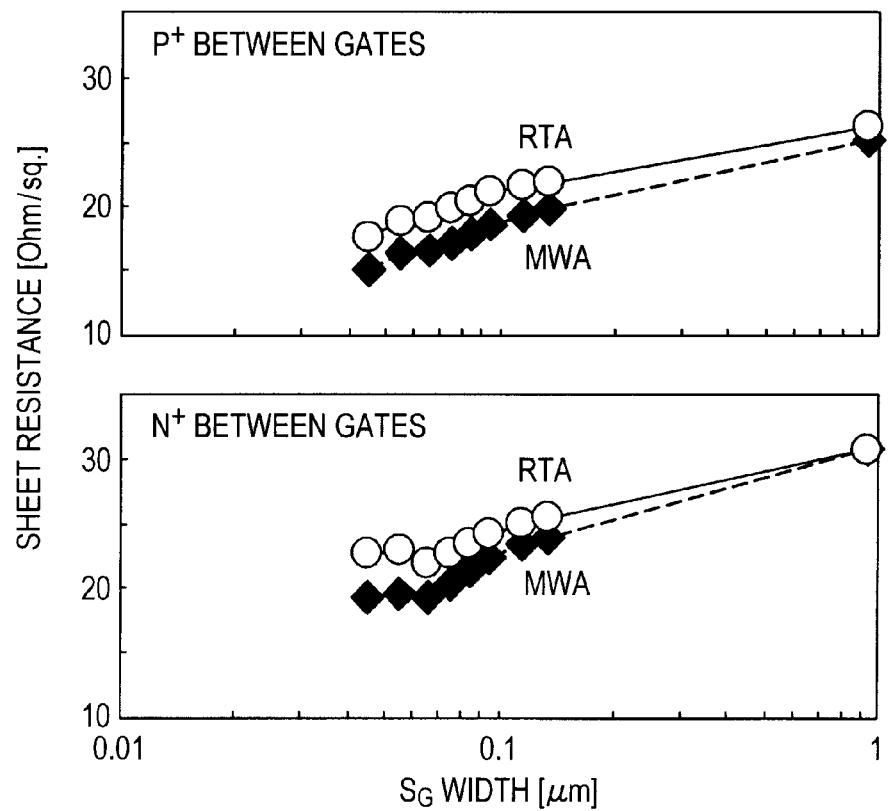
FIG. 31 is graphs each showing the relationship between the width of the metal silicide layer and the sheet resistance of the metal silicide layer.
Figure 32:
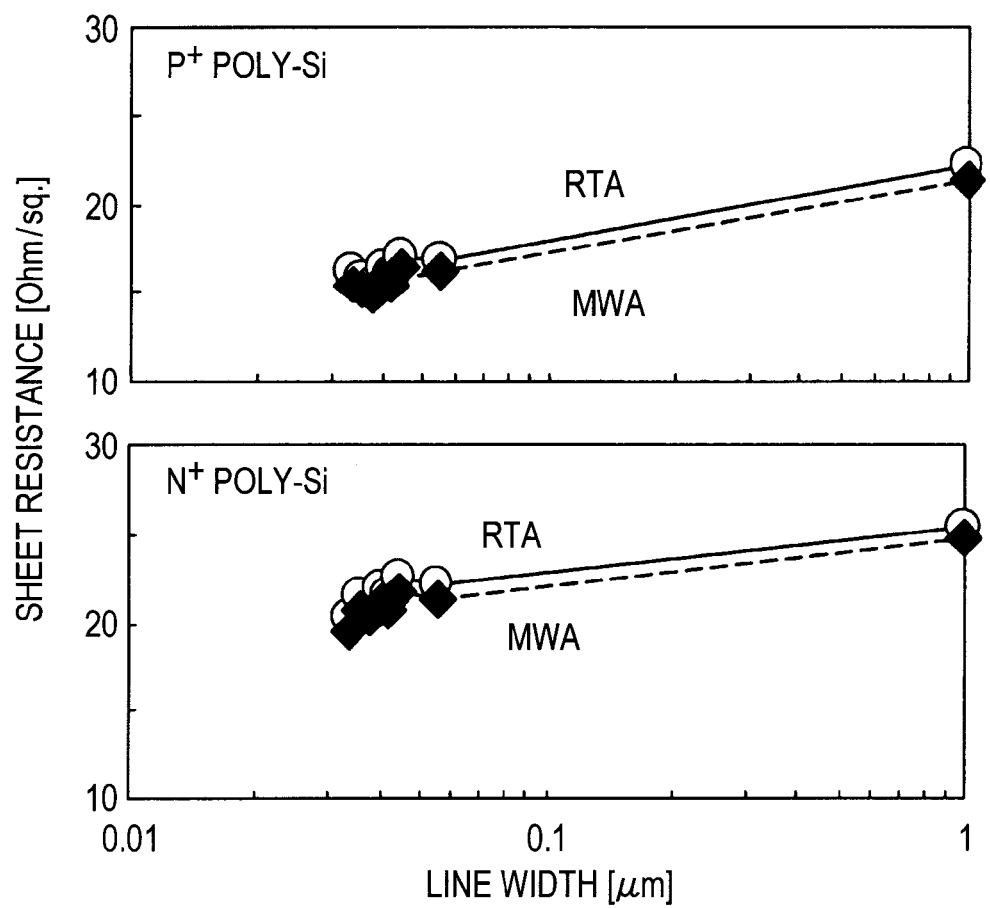
FIG. 32 is graphs each showing the relationship between the width of the metal silicide layer and the sheet resistance of the metal silicide layer.

In addition, in the semiconductor device of the present embodiment, the sheet resistance of each of the metal silicide layers 41 shown in FIG. 1 can be reduced as shown in FIGS. 31 and 32. FIGS. 31 and 32 show the sheet resistances of the metal silicide layers when the heat-conduction type anneal apparatus is used in the second heat treatment (RTA shown in FIGS. 31 and 32) and when the microwave anneal apparatus is used in the second heat treatment (MWA shown in FIGS. 31 and 32). In FIG. 31, each of the abscissa axes shows the distance between the respective gates of adjacent MISFETs when the MISFETs share, e.g., a drain region, and each of the ordinate axes shows the sheet resistance per unit area of the metal silicide layer over the foregoing drain region. In FIG. 32, each of the abscissa axes shows the gate length of the gate electrode and each of the ordinate axes shows the sheet resistance per unit area of the metal silicide layer over the foregoing gate electrode. In FIG. 31, the upper graph shows the sheet resistance of the metal silicide layer over the p-type diffusion layer of the p-channel MISFET, while the lower graph shows the sheet resistance of the metal silicide layer over the n-type diffusion layer of the re-channel MISFET. In FIG. 32, the upper graph shows the sheet resistance of the metal silicide layer over the gate electrode formed of p-type polysilicon, while the lower graph shows the sheet resistance of the metal silicide layer over the gate electrode formed of n-type polysilicon. As can be seen from FIGS. 31 and 32, in the semiconductor device of the present embodiment using the microwave anneal apparatus in the second heat treatment, the metal silicide layers can be accurately formed to have smaller film thicknesses than when the heat-conduction type anneal apparatus is used. Therefore, it is possible to reduce the sheet resistances of the metal silicide layers.

Figure 33:
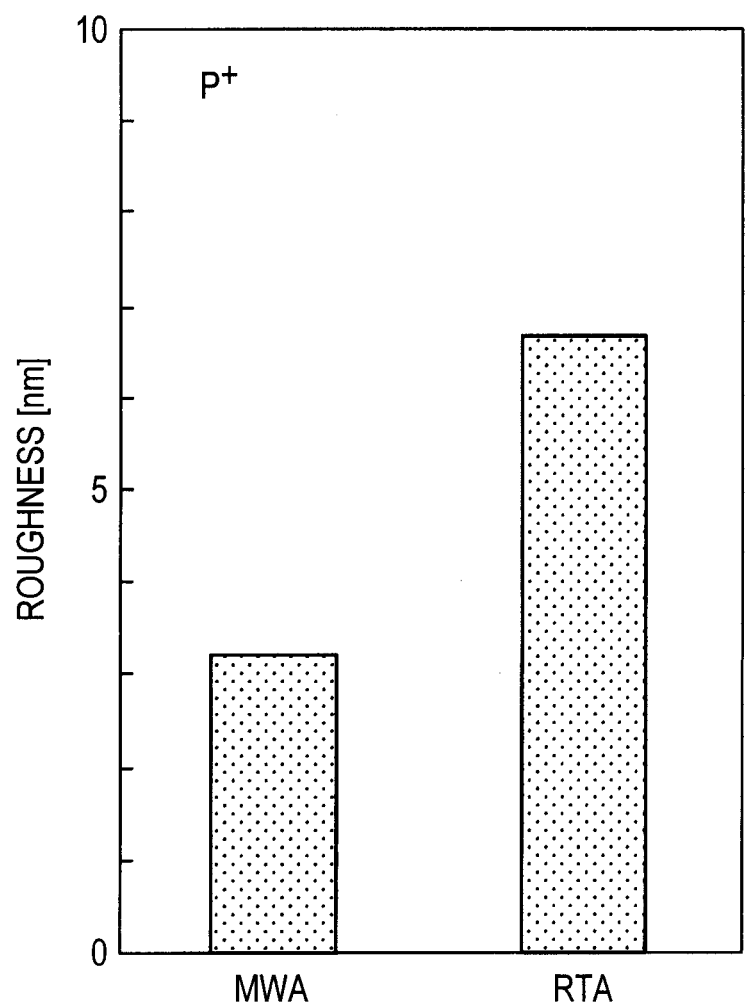
FIG. 33 is graphs each showing the planarity of the interface between the metal silicide layer and the semiconductor substrate.
Figure 34:
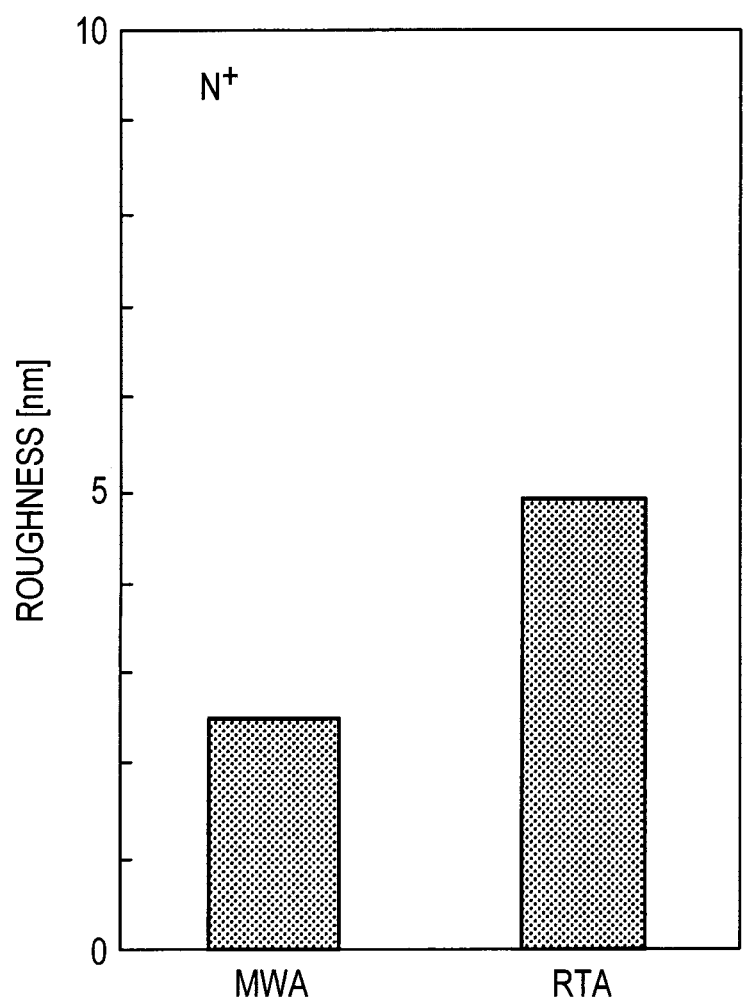
FIG. 34 is graphs each showing the planarity of the interface between the metal silicide layer and the semiconductor substrate.

Also, as shown in FIGS. 33 and 34, compared with the case where the heat-conduction type anneal apparatus is used in the second heat treatment (RTA shown in FIGS. 33 and 34), in the case where the microwave anneal apparatus is used in the second heat treatment (MWA shown in FIGS. 33 and 34) as in the present embodiment, it is possible to reduce roughness at the interfaces between the metal silicide layers and the semiconductor substrate, which are the bottom surfaces of the metal silicide layers, and form flat interfaces. FIGS. 33 and 34 are graphs respectively showing, as the ordinate axes thereof, the values of the differences between the lowest positions of the foregoing interfaces and the highest positions thereof in the $p^+$-type semiconductor substrate and in the $n^+$-type semiconductor substrate. Note that the $p^+$-type semiconductor substrate mentioned herein corresponds to, e.g., the $p^+$-type semiconductor regions 10b shown in FIG. 1 and the $n^+$-type semiconductor substrate mentioned herein corresponds to, e.g., the $n^+$-type semiconductor regions 9b shown in FIG. 1.

As shown in FIG. 33, in the $p^+$-type semiconductor substrate, the foregoing interface which has a level difference of about 7 nm when the heat-conduction type anneal apparatus is used in the second heat treatment is improved to have a level difference of about 3 nm when the microwave anneal apparatus is used. As shown in FIG. 34, in the $n^+$-type semiconductor substrate, the foregoing interface which has a level difference of about 5 nm when the heat-conduction type anneal apparatus is used in the second heat treatment is improved to have a level difference of about 2.5 nm when the microwave anneal apparatus is used. By thus using the microwave anneal apparatus in the second heat treatment, the film thicknesses of the metal silicide layers can be accurately controlled. In addition, in a CMISFET shown in, e.g., FIG. 1, the distances between the metal silicide layers 41 and the n-type well 6 or the p-type well 5 become more uniform. Therefore, it is possible to hold constant the characteristic of the junction leakage current in the metal silicide layers 41 and improve the reliability of the semiconductor device.

Note that, even when the second heat treatment is performed using the microwave anneal apparatus to form the metal silicide layers 41 as in the semiconductor device of the present embodiment, the performance of elements is not inferior to that in the semiconductor device when the heat-conduction type anneal apparatus is used in the second heat treatment to form the metal silicide layers 41. That is, even if the microwave anneal apparatus or the heat-conduction type anneal apparatus is used in the second heat treatment, the threshold voltage, OFF current, or lifetime of the formed MISFET are substantially equal.

While the invention achieved by the present inventors has been specifically described heretofore based on the embodiment thereof, the present invention is not limited to the foregoing embodiment. It will be appreciated that various changes and modifications can be made in the invention within the scope not departing from the gist thereof.

The present invention is effective when applied to a manufacturing technique for a semiconductor device including a semiconductor element having a metal silicide layer.

What is claimed is:

1. A method of manufacturing a semiconductor device, comprising the steps of:
    (a) preparing a semiconductor substrate;
    (b) forming a semiconductor region in the semiconductor substrate;
    (c) forming a metal film over the semiconductor substrate including the semiconductor region;
    (d) performing a first heat treatment to cause the metal film to selectively react with the semiconductor region and form a metal silicide layer over the semiconductor region;
    (e) after the step (d), removing an unreacted part of the metal film to leave the metal silicide layer over the semiconductor region;
    (f) after the step (e), performing a second heat treatment; and
    (g) after the step (f), forming an insulating film over the semiconductor substrate including the metal silicide layer,
    wherein, in the step (d), the first heat treatment is performed using a heat-conduction type anneal apparatus,
    wherein, in the step (f), the second heat treatment is performed using a microwave anneal apparatus,
    wherein the metal film contains nickel (Ni) and platinum (Pt); and
    wherein, in the step (f), platinum (Pt) is segregated at a bottom surface of the metal silicide layer by the second heat treatment.

2. A method of manufacturing the semiconductor device according to claim 1,
    wherein, in the step (d), the metal silicide layer mainly formed of $Ni_2Si$ is formed by the first heat treatment, and
    wherein, in the step (f), the metal silicide layer is phase transformed into a NiSi phase by the second heat treatment.

3. A method of manufacturing the semiconductor device according to claim 1,
    wherein the metal silicide layer formed in the step (d) contains a microcrystal of NiSi.

4. A method of manufacturing the semiconductor device according to claim 1,
    wherein, in the step (f), the second heat treatment is performed by controlling a power of the microwave anneal apparatus in a range of not less than 800 W and not more than 2000 W.

5. A method of manufacturing the semiconductor device according to claim 1, further comprising the step of:
    (h) forming a coupling member containing tungsten (W) and extending from an upper surface of the insulating film to reach an upper surface of the metal silicide layer.

6. A method of manufacturing the semiconductor device according to claim 1, further comprising the step of:
    (i) after the step (f), forming an interconnect containing Cu over the semiconductor substrate.

7. A method of manufacturing the semiconductor device according to claim 1,
    wherein a film thickness of the metal silicide layer is not more than 15 nm.

8. A method of manufacturing the semiconductor device according to claim 1,
    wherein the semiconductor region forms each of source/drain regions of a field effect transistor.

9. A method of manufacturing a semiconductor device, comprising the steps of:
    (a) preparing a semiconductor substrate;
    (b) forming a semiconductor region in the semiconductor substrate;
    (c) forming a metal film over the semiconductor substrate including the semiconductor region;
    (d) performing a first heat treatment to cause the metal film to selectively react with the semiconductor region and form a metal silicide layer over the semiconductor region;
    (e) after the step (d), removing an unreacted part of the metal film to leave the metal silicide layer over the semiconductor region;
    (f) after the step (e), performing a second heat treatment; and
    (g) after the step (f), forming an insulating film over the semiconductor substrate including the metal silicide layer,
    wherein, in the step (d), the first heat treatment is performed using a heat-conduction type anneal apparatus,
    wherein, in the step (f), the second heat treatment is performed using a microwave anneal apparatus,
    wherein, in the step (d), the metal silicide layer mainly formed of $Ni_2Si$ is formed by the first heat treatment, and
    wherein, in the step (f), the metal silicide layer is phase transformed into a NiSi phase by the second heat treatment.

* * * * *